(12) United States Patent
Chen et al.

(10) Patent No.: US 10,833,053 B1
(45) Date of Patent: Nov. 10, 2020

(54) SEMICONDUCTOR PACKAGE AND METHOD OF FORMING THE SAME

(71) Applicant: Taiwan Semiconductor Manufacturing Co., Ltd., Hsinchu (TW)

(72) Inventors: Wei-Chih Chen, Taipei (TW);
Hung-Jui Kuo, Hsinchu (TW);
Yu-Hsiang Hu, Hsinchu (TW);
Sih-Hao Liao, New Taipei (TW);
Hung-Chun Cho, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/513,732

(22) Filed: Jul. 17, 2019

(51) Int. Cl.
| | |
|---|---|
| *H01L 23/495* | (2006.01) |
| *H01L 25/065* | (2006.01) |
| *H01L 23/31* | (2006.01) |
| *H01L 23/538* | (2006.01) |
| *H01L 21/56* | (2006.01) |
| *H01L 23/00* | (2006.01) |
| *H01L 21/48* | (2006.01) |

(52) U.S. Cl.
CPC ...... *H01L 25/0655* (2013.01); *H01L 21/4857* (2013.01); *H01L 21/56* (2013.01); *H01L 23/3128* (2013.01); *H01L 23/5383* (2013.01); *H01L 24/13* (2013.01); *H01L 24/18* (2013.01); *H01L 2224/11821* (2013.01); *H01L 2224/11822* (2013.01); *H01L 2224/1369* (2013.01)

(58) Field of Classification Search
USPC .......... 257/100, 433, 667, 787–796, 257/E31.117–E31.118, E51.02, 257/E23.116–E23.14, E25.031–E25.032, 257/E23.042, 678–733
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |

(Continued)

*Primary Examiner* — Niki H Nguyen
(74) *Attorney, Agent, or Firm* — JCIPRNET

(57) ABSTRACT

A semiconductor package includes a first die, a second die, a molding compound and a redistribution structure. The first die has a first conductive pillar and a first complex compound sheath surrounding and covering a sidewall of the first conductive pillar. The second die has a second conductive pillar and a protection layer laterally surrounding the second conductive pillar. The molding compound laterally surrounds and wraps around the first and second dies, and is in contact with the first complex compound sheath of the first die. The redistribution structure is disposed on the first and second dies and the molding compound. The redistribution structure has a first via portion embedded in the first polymer dielectric layer and a second via portion embedded in the second polymer dielectric layer. A base angle of the first via portion is greater than a base angle of the second via portion.

20 Claims, 20 Drawing Sheets

(56) References Cited

U.S. PATENT DOCUMENTS

| | | | |
|---|---|---|---|
| 9,372,206 B2 | 6/2016 | Wu et al. | |
| 9,496,189 B2 | 11/2016 | Yu et al. | |
| 2016/0276277 A1* | 9/2016 | Syu | H01L 23/53228 |
| 2019/0096841 A1* | 3/2019 | Liu | H01L 23/5384 |

* cited by examiner

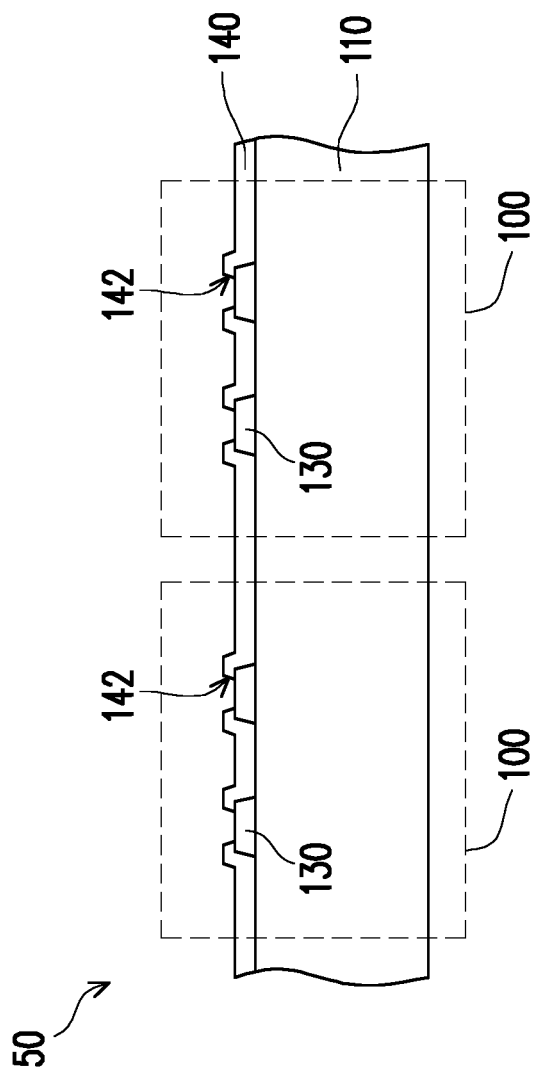
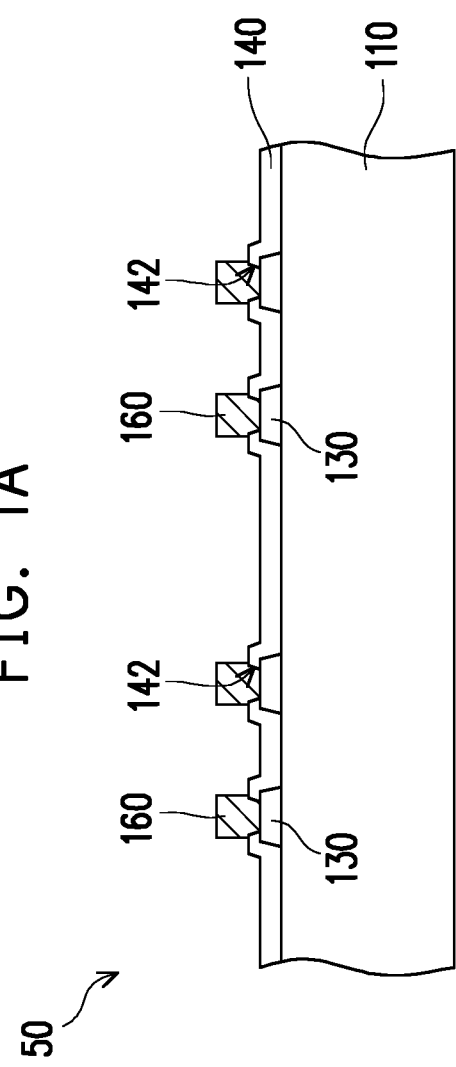

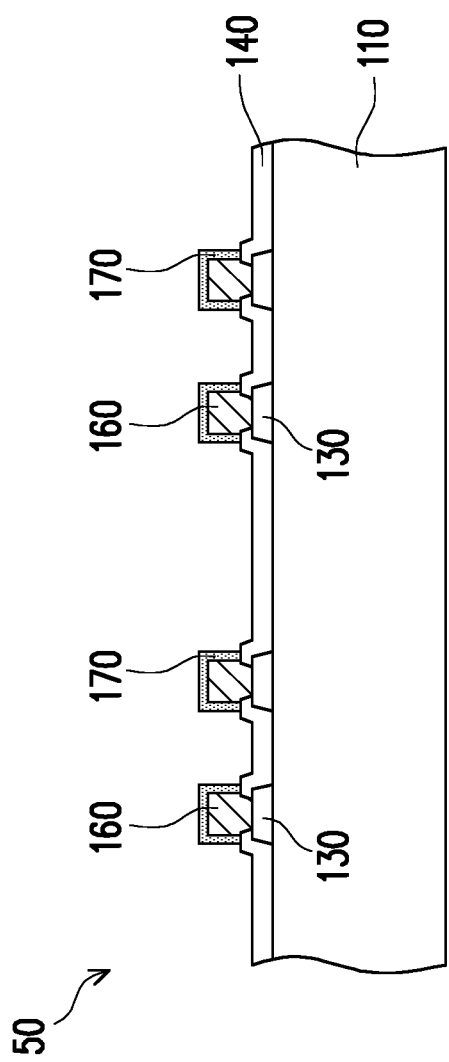
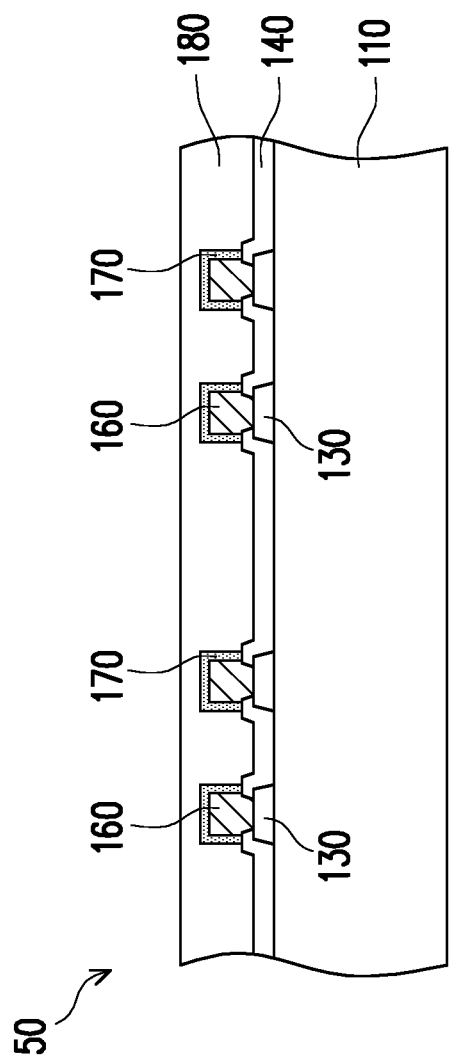

SEMICONDUCTOR PACKAGE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. The improved routing capability and reliability provided by the integrated fan-out packages are key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1F are schematic cross-sectional views illustrating a manufacturing process of a semiconductor die in accordance with some embodiments of the present disclosure.

DETAILED DESCRIPTION

Figure 1E:
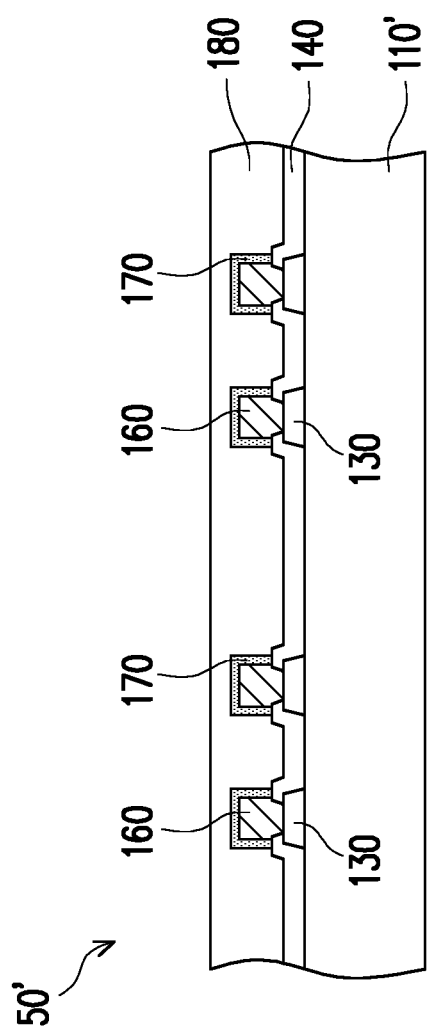

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic cross-sectional views illustrating a manufacturing process of a semiconductor die in accordance with some embodiments of the present disclosure.

Referring to FIG. 1A, in some embodiments, a wafer 50 including a plurality of integrated circuit components or semiconductor dies 100 arranged in an array is provided. Before a singulation process is performed on the wafer 50, the semiconductor dies 100 of the wafer 50 are connected one another. In some embodiments, the wafer 50 includes a semiconductor substrate 110, a plurality of conductive pads 130 and a passivation layer 140. The conductive pads 130 are disposed over the semiconductor substrate 110. The passivation layer 140 is formed over the substrate 110 and has a plurality of contact openings 142 that partially expose the conductive pads 130. For example, the semiconductor substrate 110 may be a silicon substrate including active components (e.g., transistors or the like) and/or passive components (e.g., resistors, capacitors, inductors or the like) formed therein. The conductive pads 130 may be aluminum pads, copper pads or other suitable metallic pads. In some embodiments, the passivation layer 140 may be a polybenzoxazole (PBO) layer, a polyimide (PI) layer or other suitable polymers. In some alternative embodiments, the passivation layer 140 may be made of inorganic materials, such as silicon oxide, silicon nitride, silicon oxynitride, or any suitable dielectric material.

In some alternative embodiments, the wafer 50 may optionally include a post-passivation layer (not shown) formed over the passivation layer 140. The post-passivation layer covers the passivation layer 140 and has a plurality of contact openings. The conductive pads 130 exposed by the contact openings 142 of the passivation layer 140 are partially exposed by the contact openings of the post-passivation layer. In some embodiments, the post-passivation layer may be a polybenzoxazole (PBO) layer, a polyimide (PI) layer or other suitable polymers. In some alternative embodiments, the post-passivation layer may be made of inorganic materials, such as silicon oxide, silicon nitride, silicon oxynitride, or any suitable dielectric material.

Referring to FIG. 1B, in some embodiments, a plurality of conductive pillars 160 are formed on the conductive pads 130. In some embodiments, the conductive pillars 160 are plated on the conductive pads 130. The plating process of conductive pillars 160 is described in detail as followings. First, a seed layer (not shown) is formed on the top surface of the passivation layer 140 and extends into the contact openings 142 of the passivation layer 140. The seed layer may be formed by a physical vapor deposition process, such as sputtering or the like, and the seed layer may be a metal seed layer such as a copper seed layer, or a composite layer such as a titanium layer and a copper layer over the titanium layer. Then, a patterned photoresist layer (not shown) having a plurality of openings is formed over the seed layer. The plurality of openings of the patterned photoresist layer expose portions of the seed layer that are corresponding to the conductive pads 130. Then, a plating process is performed to form the conductive pillars 160 on the seed layer within the openings of the patterned photoresist layer. Thereafter, the patterned photoresist layer is removed and the seed layer not covered by the conductive pillars 160 is removed (e.g., by an etching process). In some embodiments, the conductive pillars 160 are plated copper pillars.

Referring to FIG. 1C, in some embodiments, after the conductive pillars 160 are formed, a complex compound layer 170 is formed on top surfaces and sidewalls of the conductive pillars 160. In some embodiments, an organic compound solution (not shown) which may react with metallic materials is applied on the conductive pillars 160. In some embodiments, the pH value of the organic compound solution may range from about 8 to about 12. After the organic compound solution reacts with the conductive pillars 160, the complex compound layer 170 is formed. In some embodiments, the organic compound solution is applied through, for example, a spraying process or a dipping process. Then, a thermal process is performed at about 25 Celsius degree to about 80 Celsius degree for about 1 minute to about 5 minutes to form bonding between the organic compound solution and the conductive pillars 160, and subsequently the organic compound solution which is un-bonding to the conductive pillars 160 is removed by rinsing, and thereby the complex compound layer 170 is formed. The complex compound layer 170 may provide better adhesion between the conductive pillars 160 and the later-formed layers (i.e. protection layer 180 shown in FIG. 1D). In some embodiments, a pre-cleaning step may be optionally performed before applying the organic compound solution on the conductive pillars 160.

In some embodiments, the organic compound solution may include an imidazole derivative represented by the following chemical formula 1, while the complex compound layer 170 may include a metal complex of imidazole derivative.

(chemical formula 1)

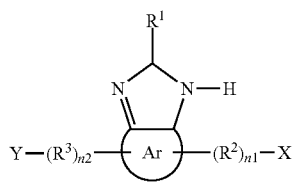

In the chemical formula 1, $R^1$ is hydrogen, or a substituted or unsubstituted alkyl group, $R^2$ to $R^3$ are the same as or different from each other, and are each independently a substituted or unsubstituted alkylene group, n1 and n2 are each independently an integer ranging from 1 to 30, and are the same as or different from each other, X and Y are the same as or different from each other, and are each independently —H; —OH; —SH; —F; Cl; Br; —I; a carboxyl group; a ester group; an amine group, a quaternary ammonium cation, trimethylsilyl; triethylsilyl; a sulfo group; a carbonyl group, a carbonate ester group; an amide group; or an epoxy group, and Ar ring is any one selected from the following structures.

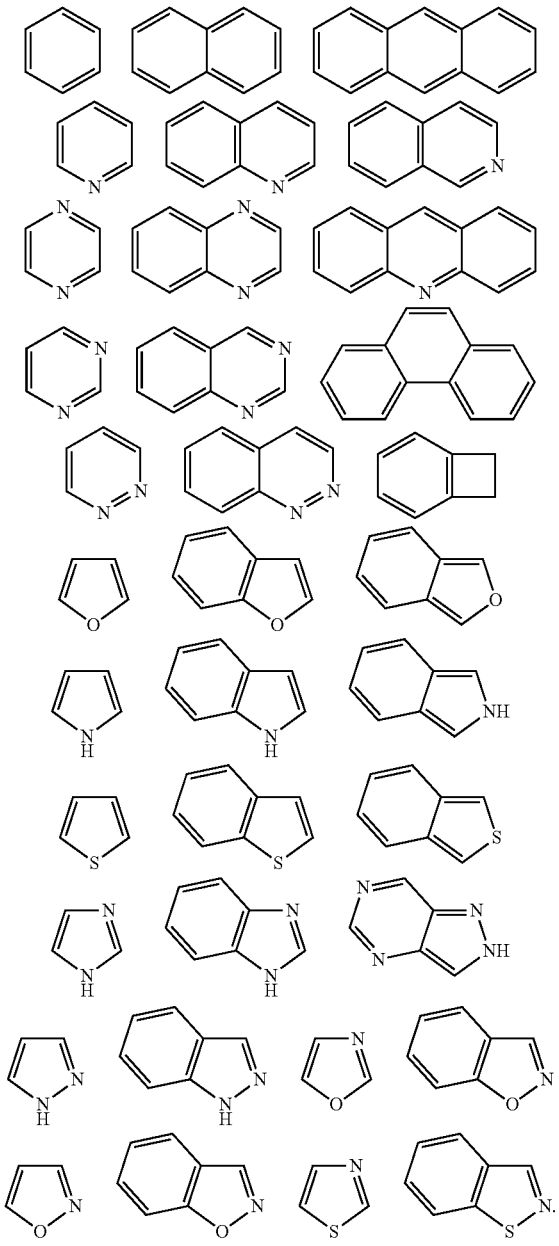

Figure 1F:
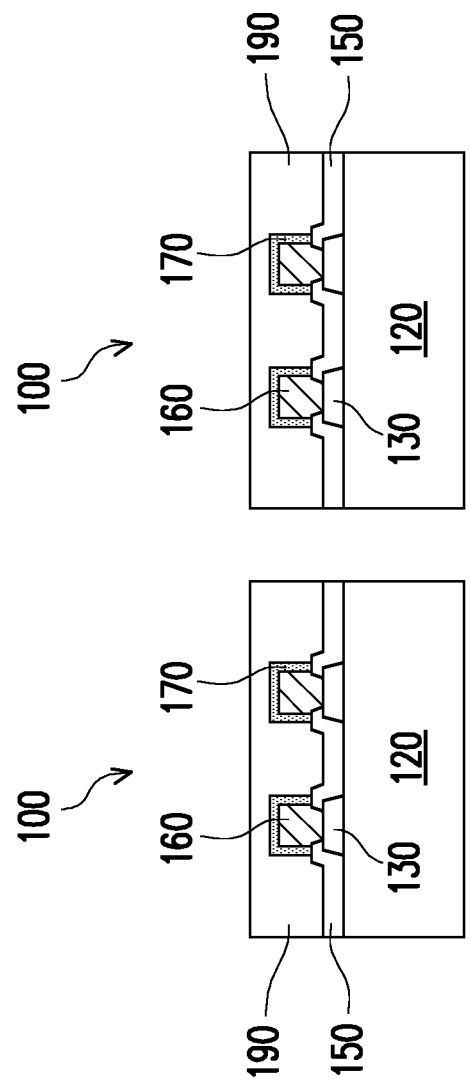
Figure 1G:
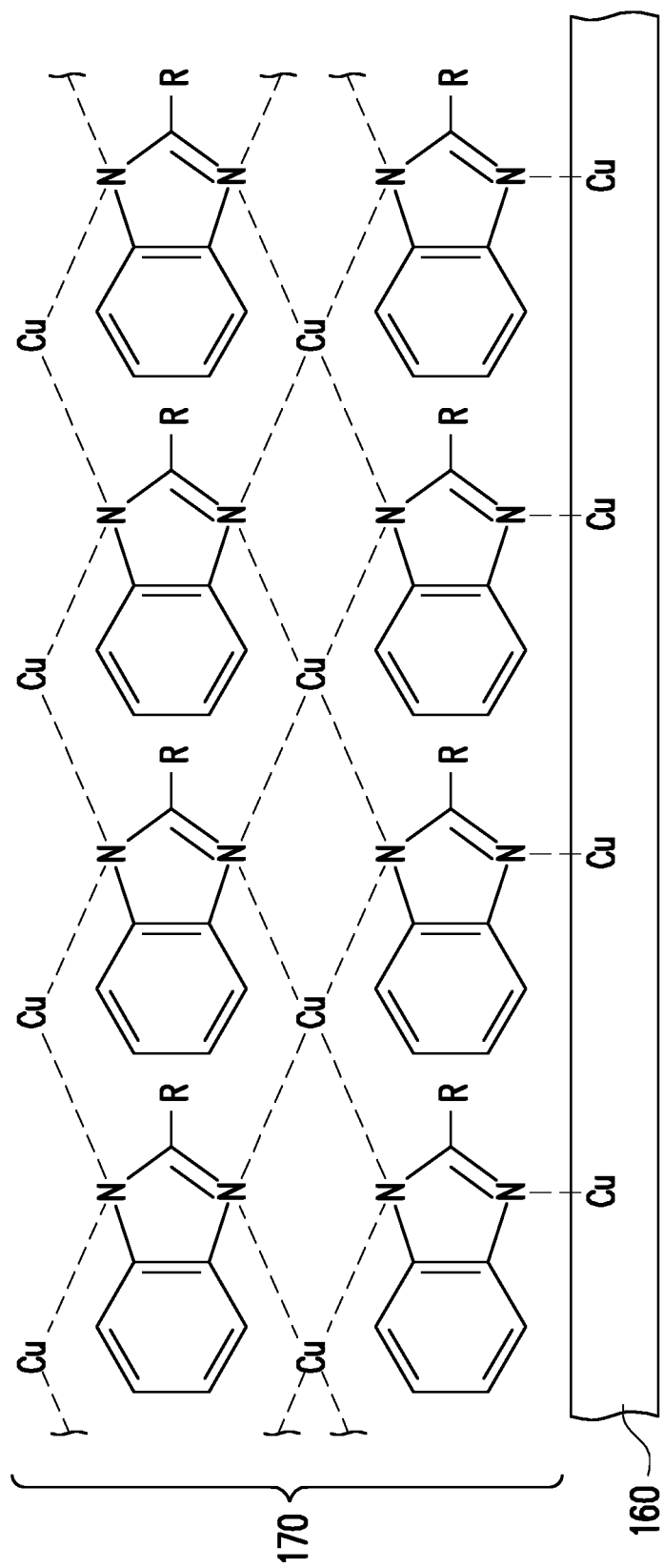
FIG. 1G is schematic cross-sectional views illustrating an example of a complex compound layer in accordance with some embodiments of the present disclosure.

FIG. 1G shows an example of the complex compound layer 170 on the conductive pillars 160. However, the imidazole derivative may be any one selected from the aforementioned structures. As shown in FIG. 1G, after the organic compound solution (e.g. including imidazole derivative) reacts with the metal (e.g. copper) of the conductive pillars 160, the complex compound layer 170 (e.g. copper complex of imidazole derivative) is formed on the conductive pillars 160. In some embodiments, a thickness of the complex compound layer 170 may range from about ten nanometers to about hundreds of nanometers.

Referring to FIG. 1D, in some embodiments, after the complex compound layer 170 is formed, a protection layer 180 is formed on the passivation layer 140 so as to cover the conductive pillars 160. In some embodiments, the protection layer 180 has a sufficient thickness to encapsulate and fully cover the conductive pillars 160. In some embodiments, the protection layer 180 may be a polybenzoxazole (PBO) layer, a polyimide (PI) layer or other suitable polymers. In some alternative embodiments, the protection layer 180 may be made of inorganic materials, such as silicon oxide, silicon nitride, silicon oxynitride, or any suitable dielectric material. In some embodiments, the material of the protection layer 180 may be the same as the material(s) of the passivation layer 140 and/or the post-passivation layer. In some embodiments, the material of the protection layer 180 may be different from the material(s) of the passivation layer 140 and/or the post-passivation layer.

Referring to FIG. 1E, in some embodiments, a back side grinding process is performed on the rear surface of the wafer 50 after the protection layer 180 is formed. During the back side grinding process, the semiconductor substrate 110 is ground such that a thinned wafer 50' including a thinned semiconductor substrate 110' is formed.

Referring to FIG. 1F, in some embodiments, after performing the back side grinding process, a singulation process is performed on the thinned wafer 50' to individualize the semiconductor dies 100. Each of the singulated semiconductor dies 100 includes a semiconductor substrate 120, the conductive pads 130 formed on the semiconductor substrate 120, a passivation layer 150, the conductive pillars 160, the complex compound layer 170 and a protection layer 190. In one embodiment, the singulation process is a wafer dicing process including mechanical sawing or laser cutting. As shown in FIG. 1E and FIG. 1F, the materials and the characteristics of the semiconductor substrate 120, the passivation layer 150 and the protection layer 190 in FIG. 1F are the same as those of the semiconductor substrate 110', the passivation layer 140 and the protection layer 180 in FIG. 1E. Thus, the detailed descriptions are omitted.

As shown in FIG. 1E and FIG. 1F, during the back side grinding and the wafer dicing processes, the protection layer 180 and 190 may well protect the conductive pillars 160 of the semiconductor die 100. In addition, the conductive pillars 160 of the semiconductor die 100 may be protected from being damaged by sequentially performed processes, such as pick and place process of the semiconductor dies 100, molding process, and so on.

FIG. 2 to FIG. 15 are schematic cross-sectional views illustrating a manufacturing process of a semiconductor package in accordance with some embodiments of the disclosure. In exemplary embodiments, the manufacturing method is part of a wafer level packaging process. In some embodiments, one die is shown to represent plural dies of the wafer, and one semiconductor package is shown to represent plural semiconductor packages obtained following the manufacturing method.

Figure 2:
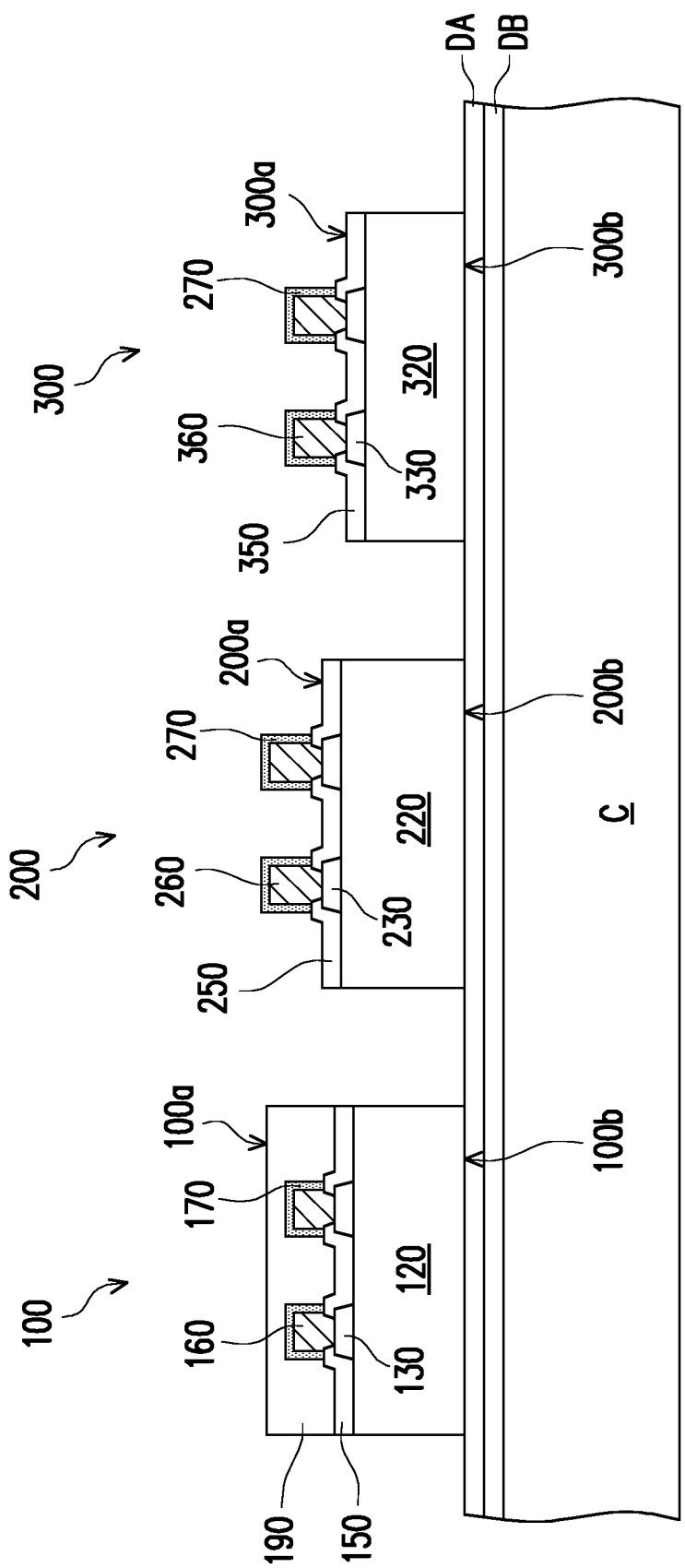
FIG. 2 to FIG. 15 are schematic cross-sectional views illustrating a manufacturing process of a semiconductor package in accordance with some embodiments of the disclosure.

Referring to FIG. 2, in some embodiments, a carrier C is provided. In some embodiment, the carrier C may be a glass carrier, a ceramic carrier or any suitable carrier for carrying a semiconductor die for the manufacturing method of the semiconductor package. In some embodiments, a debond layer DB is formed on the carrier C. In some embodiments, the debond layer DB is formed by, for example, a spin coating process, and a material of the debond layer DB may be any material suitable for bonding and debonding the carrier C from the overlying layer(s) or any wafer(s) disposed thereon. In some embodiments, the debond layer DB may include a release layer (such as a light-to-heat conversion ("LTHC") layer) or an adhesive layer (such as a ultra-violet curable adhesive or a heat curable adhesive layer).

In some embodiments, the semiconductor die 100, a semiconductor die 200 and a semiconductor die 300 are provided over the carrier C. In some embodiments, in FIG. 2, one semiconductor die 100 is shown, but the number of the semiconductor die 100 is not limited to be one but can be more than one. Similarly, the number of the semiconductor dies 200 or 300 is not limited to be two but can be more than two. In some embodiments, the semiconductor die 100, the semiconductor die 200 and the semiconductor die 300 may be provided through a pick and place process. In some embodiments, the semiconductor die 100, the semiconductor die 200 and the semiconductor die 300 are attached (or adhered) to the debond layer DB through a die attach film DA. In some embodiments, the semiconductor die 200 includes a semiconductor substrate 220, a plurality of conductive pads 230, a passivation layer 250 and a plurality of conductive pillars 260, and the semiconductor die 300 includes a semiconductor substrate 320, a plurality of conductive pads 330, a passivation layer 350 and a plurality of conductive pillars 360. In some embodiments, the materials and the characteristics of the semiconductor substrates, the conductive pads, the passivation layers and the conductive pillars of the semiconductor dies 200 and 300 are similar to those of the semiconductor die 100, and the detailed description is thus omitted herein.

In some embodiments, after the semiconductor die 100, the semiconductor die 200 and the semiconductor die 300 are provided over the carrier C, a complex compound layer 270 is formed on top surfaces and sidewalls of the conductive pillars 260 and the conductive pillars 270. However, in some alternative embodiments, the complex compound layer 270 is formed on top surfaces and sidewalls of the conductive pillars 260 and the conductive pillars 270 before the semiconductor die 200 and the semiconductor die 300 are provided over the carrier C. In some embodiments, the material and the forming method of the complex compound layer 270 are similar to those of the complex compound layer 170, and the detailed description is thus omitted herein. The complex compound layer 270 may provide better adhesion between the conductive pillars 260 and the later-formed layers (i.e. molding compound 400 shown in FIG. 3) and between the conductive pillars 360 and the later-formed layers (i.e. molding compound 400 shown in FIG. 3).

As shown in FIG. 2, in some embodiments, semiconductor die 200 and the semiconductor die 300 are similar to the semiconductor die 100. A difference therebetween lies in that the semiconductor die 200 and the semiconductor die 300 do not have protection layers, and the conductive pillars 260 and 360 with the complex compound layer 270 are exposed.

As shown in FIG. 2, the semiconductor die 100 has a front surface (active surface) 100a and a rear surface 100b opposite to the front surface 100a, the semiconductor die 200 has a front surface (active surface) 200a and a rear surface 200b opposite to the front surface 200a, and the semiconductor die 300 has a front surface (active surface) 300a and a rear surface 300b opposite to the front surface 300a. In some embodiments, the rear surface 100b of the semiconductor die 100, the rear surface 200b of the semiconductor die 200 and the rear surface 300b of the semiconductor die 300 are attached (or adhered) to the debond layer DB through the die attach film DA, while the front surface 100a of the semiconductor die 100, the front surface 200a of the semiconductor die 200 and the front surface 300a of the semiconductor die 300 face up and are exposed.

In some embodiments, the semiconductor die 100, the semiconductor die 200 and the semiconductor die 300 may have the same function or different functions. In some embodiments, the semiconductor die 100, the semiconductor die 200 and the semiconductor die 300 may be any one of a system-on-chip (SoC) device, a memory device, or any other suitable types of devices. In some embodiments, the semiconductor die 100, the semiconductor die 200 and the semiconductor die 300 may respectively be an application-specific integrated circuit (ASIC) chip, an analog chip, a sensor chip, a wireless and radio frequency chip, a voltage regulator chip, a memory chip or the like. In some embodiments, the sizes (referred to the height and/or the width) of the semiconductor die 100, the semiconductor die 200 and the semiconductor die 300 may be the same or different.

Figure 3:
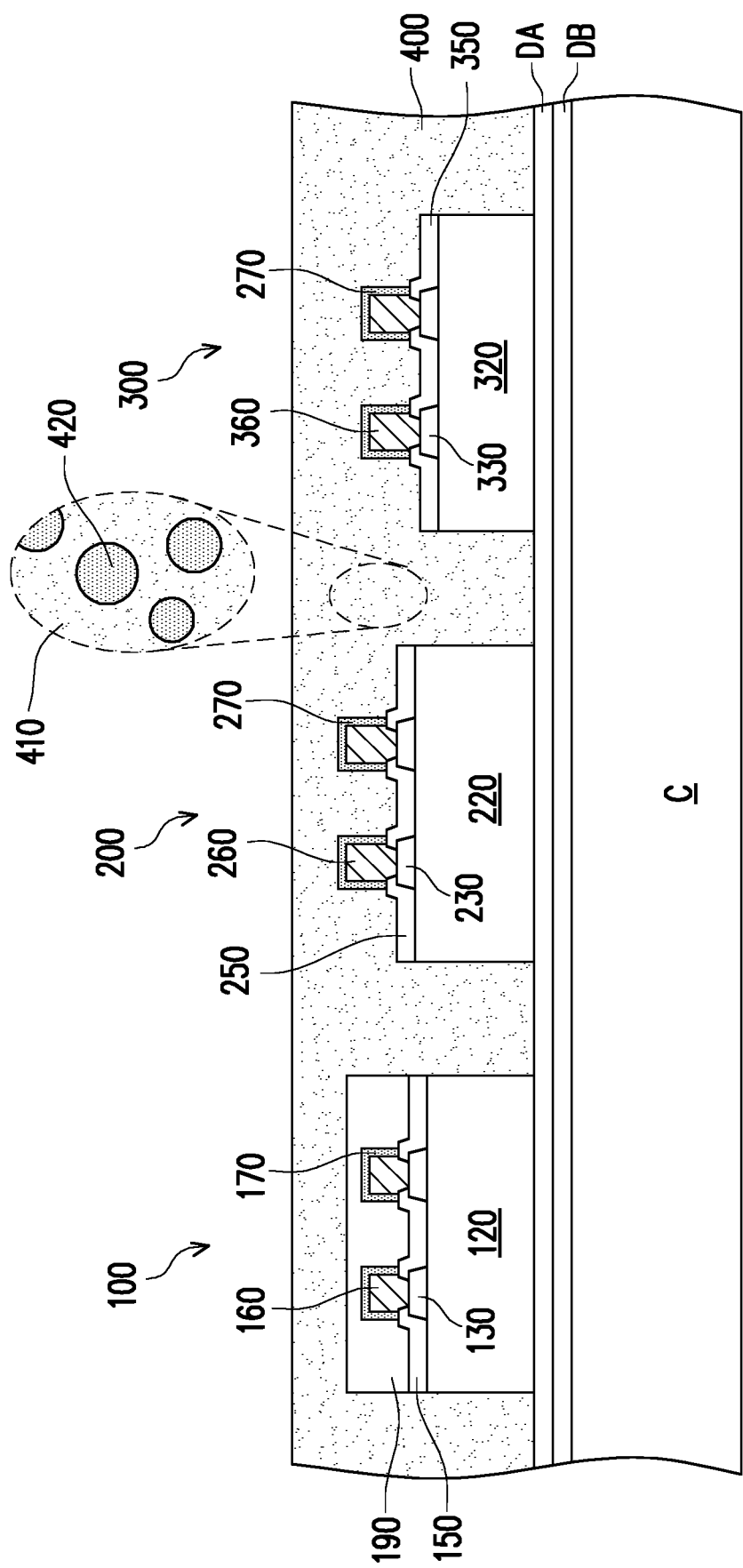

Referring to FIG. 3, in some embodiments, a molding compound 400 is formed over the carrier C, the semiconductor die 100, the semiconductor die 200 and the semiconductor die 300. In one embodiment, the molding compound 400 may be formed by the over-molding process. In some embodiments, the formed molding compound 400 covers the entirety of the semiconductor die 100, the semiconductor die 200 and the semiconductor die 300 and encapsulates the semiconductor die 100, the semiconductor die 200 and the semiconductor die 300. Due to the complex compound layer 270 of the semiconductor die 200 and the semiconductor die 300, better adhesion between the conductive pillars 260 and 270 and the molding compound 400 is provided.

In some embodiments, the molding compound 400 includes a polymer material 410 and a plurality of fillers 420 distributed in the polymer material 410. In some embodiments, the material of the polymer material 410 includes epoxy resins, phenolic resins or silicon-containing resins, or the like, and the material of the fillers 420 includes silica, alumina, zinc oxide, titanium dioxide, or the like. In some embodiments, the fillers 420 may be solid fillers.

Figure 4:
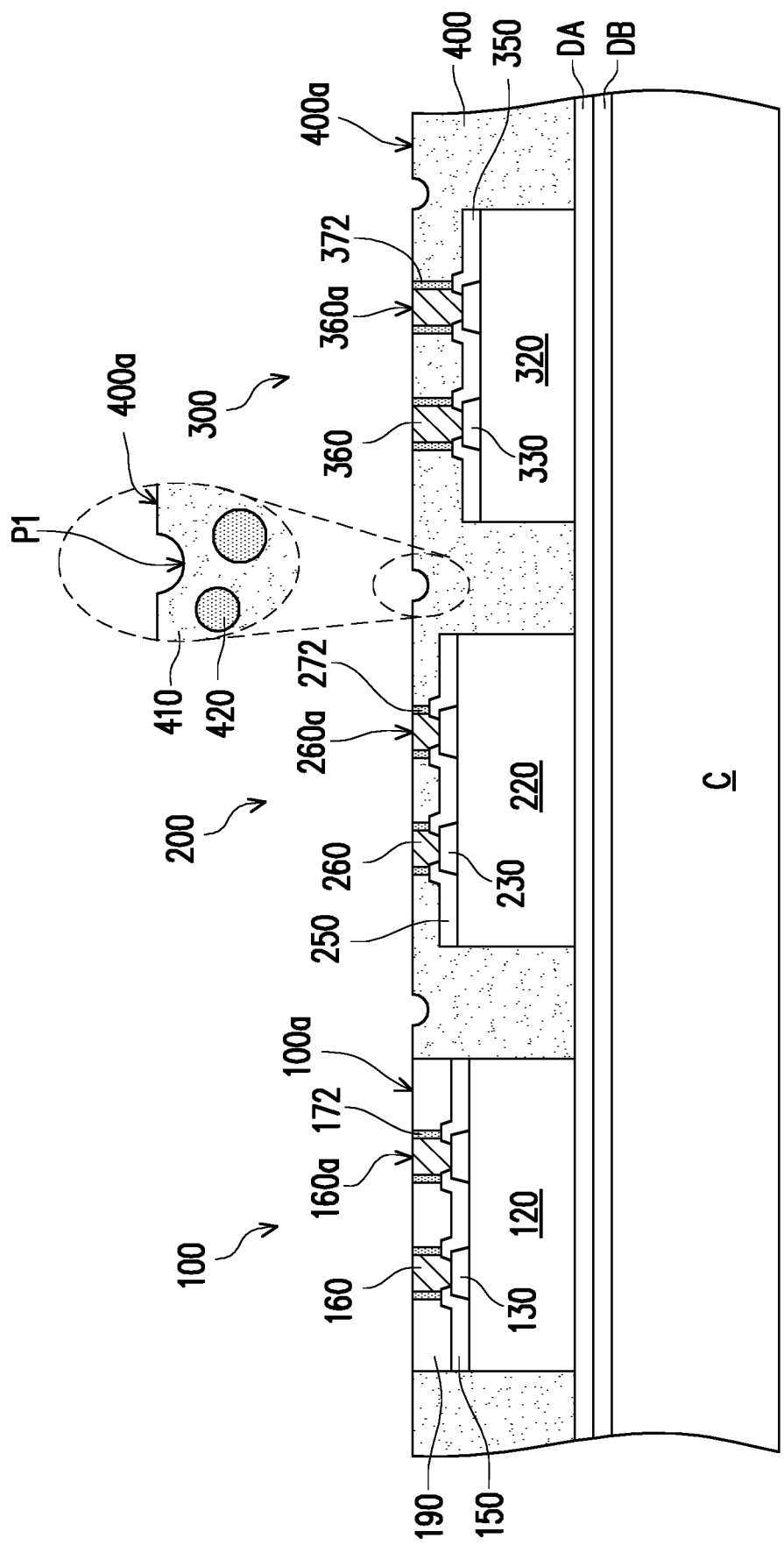

Referring to FIG. 4, in some embodiments, a planarization process is performed to remove portions of the over-molded molding compound 400 and the protection layer 190 of the semiconductor die 100 until top surfaces 160a of the conductive pillars 160, top surfaces 260a of the conductive pillars 260 and top surfaces 360a of the conductive pillars 360 are exposed. In some embodiments, through the planarization process, the complex compound layer 170 is partially removed to expose the top surface 160a of the conductive pillars 160 and form a complex compound sheath 172 surrounding and covering the sidewall of each conductive pillar 160. The complex compound layer 270 is partially removed to expose the top surface 260a of the conductive pillars 260 and top surface 360a of the conductive pillars 360 and form a complex compound sheath 272 surrounding and covering the sidewall of each conductive pillar 260 and a complex compound sheath 372 surrounding and covering the sidewall of each conductive pillar 360.

In some embodiments, the planarization process includes performing a mechanical grinding process, a chemical mechanical polishing (CMP) process or the combination thereof. After the polishing or grinding step, a cleaning step may be optionally performed to clean and remove the residues generated from the grinding or polishing step. However, the disclosure is not limited thereto, and the planarization process may be performed through any other suitable method. In some embodiments, portions of the conductive pillars 160, the conductive pillars 260 and the conductive pillars 360 may also be slightly polished or grinded to ensure the exposure of all the conductive pillars.

As shown in FIG. 4, the planarized molding compound 400 laterally encloses the semiconductor die 100, the semiconductor die 200 and the semiconductor die 300. In some embodiments, the semiconductor die 100, the semiconductor die 200 and the semiconductor die 300 are embedded in the molding compound 400, but the front surfaces 100a of the semiconductor die 100, the top surface 260a of the conductive pillars 260 and the top surface 360a of the conductive pillars 360 are not covered by the planarized molding compound 400. In some embodiments, through the planarization, the front surfaces 100a of the semiconductor die 100, the top surfaces 260a of the conductive pillars 260 and the top surfaces 360a of the conductive pillars 360 become substantially levelled with the top surface 400a of the planarized molding compound 400. In other words, the front surfaces 100a of the semiconductor die 100, the top surfaces 260a of the conductive pillars 260 and the top surfaces 360a of the conductive pillars 360 are coplanar with the top surface 400a of the planarized molding compound 400.

In some embodiments, after the planarization process, one or more pits (or referred as recesses) P1 may be formed in the planarized molding compound 400. In detail, due to the planarization process, some of the fillers 420 in an upper portion of the polymer material 410 may be removed (polished or grinded) partially, and some of the fillers 420 in an upper portion of the polymer material 410 may be removed or pulled from the polymer material 410. In some embodiments, the pits P1 are formed from the removal or release of the whole fillers 420, and the shapes of the pits may correspond to the contours of bottom portions of the removed fillers 420.

After forming the planarized molding compound 400, a redistribution structure 500 (shown in FIG. 13A) is then formed on the semiconductor die 100, the semiconductor die 200, the semiconductor die 300 and planarized molding compound 400. In some embodiments, the redistribution structure 500 includes a plurality of polymer dielectric layers 510, 530, 550 and 570 and a plurality of redistribution layers 520, 540, 560 and 580 stacked alternately. The number of the polymer dielectric layers or the redistribution layers is not limited by the disclosure. In some embodiments, the redistribution structure 500 is a front-side redistribution structure electrically connected to connectors underneath. Here, the afore-said connectors may be the conductive pillars 160 of the semiconductor die 100, the conductive pillars 260 of the semiconductor die 200 and/or the conductive pillars 360 of the semiconductor die 300. The semiconductor die 100, the semiconductor die 200 and/or the semiconductor die 300 are electrically connected to one another through the redistribution structure 500. The fabrication of the redistribution structure 500 is described in accompany with FIG. 5 through 13A in detail.

Figure 5:
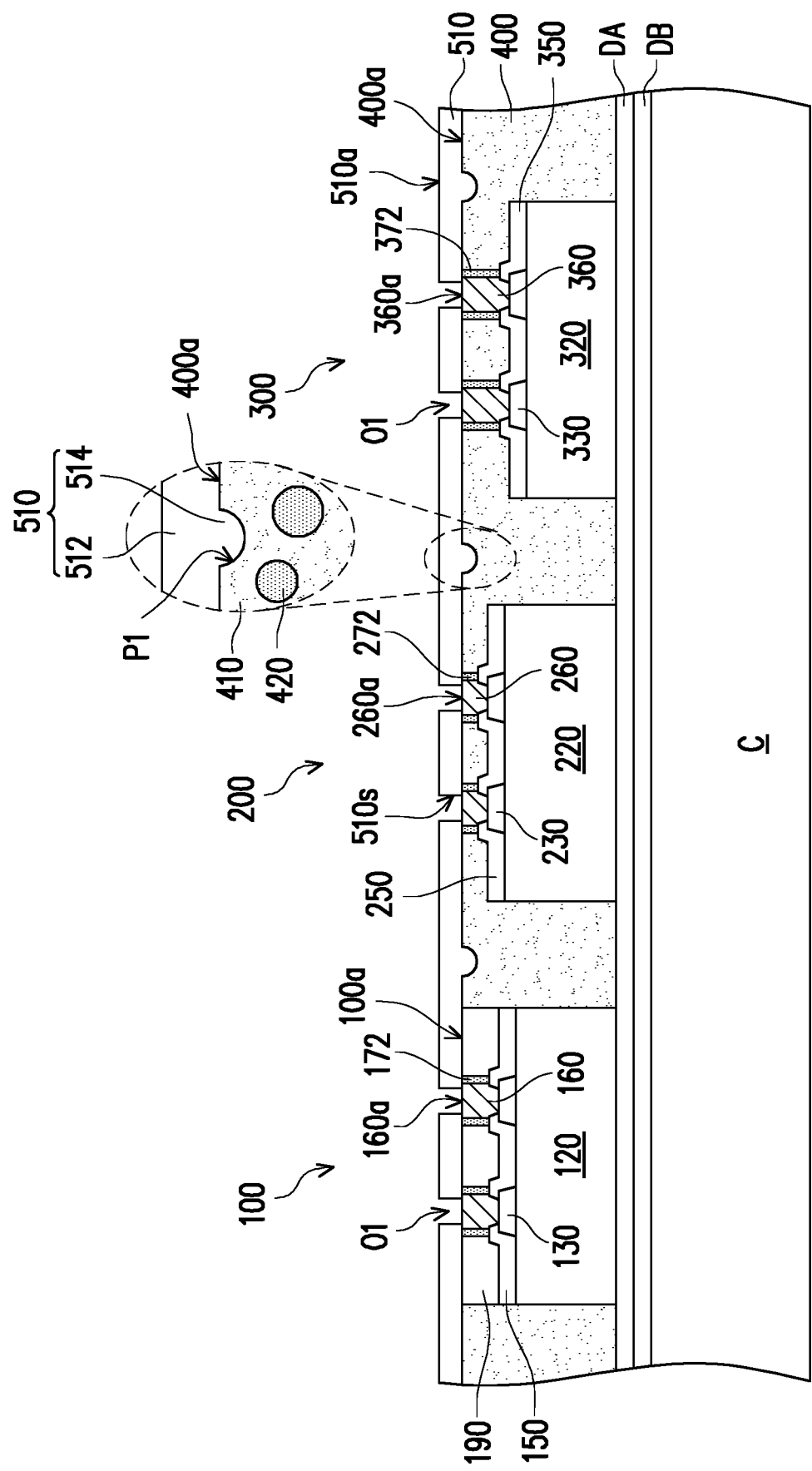

Referring to FIG. 5, in some embodiments, a polymer dielectric layer 510 is formed on the semiconductor die 100, the semiconductor die 200, the semiconductor die 300 and the molding compound 400. The polymer dielectric layer 510 has a plurality of via openings O1 which at least partially expose the conductive pillars 160, the conductive pillars 260 and the conductive pillars 360. In some embodiments, the number of the via openings O1 corresponds to the number of the conductive pillars 160, the conductive pillars 260 and the conductive pillars 360.

In some embodiments, the polymer dielectric layer 510 includes a photo-sensitive material which may be easily patterned by exposure and development processes. In some embodiments, the polymer dielectric layer 510 includes a non-shrinkage material with smaller molecular weight and lower content of the solvent. For example, the material of the polymer dielectric layer 510 may include epoxy resins, or the like. In some embodiments, the polymer dielectric layer 510 is formed by lamination. In some embodiments, the polymer dielectric layer 510 is formed by spin-coating a layer of a polymer material (not shown) on the semiconductor die 100, the semiconductor die 200, the semiconductor die 300 and the molding compound 400 and then curing the polymer material. In some embodiments, the temperature of the curing process may be about 170 Celsius degree, for example. Then, the layer of the polymer material is patterned through, for example, exposure and development processes to form the polymer dielectric layer 510. In some embodiments, during the exposure step, light is supplied with an energy dose ranging from about 600 mJ/cm$^2$ to about 1000 mJ/cm$^2$. In one embodiment, the light is supplied with light at i-line wavelength (i.e. 365 nm), or with light at g-line and h-line wavelength (i.e. 436 nm and 405 nm), or with light at g-line, h-line and i-line wavelength (i.e. 436 nm, 405 nm, and 365 nm). In some embodiments, the polymer dielectric layer 510 is made of a negative-type photosensitive material, and during the development process, portions of the polymer material layer exposed to i-line radiation become insoluble in the developer solution and remain on the underlying structure, while portions not exposed to the i-line radiation are removed during the development process.

As shown in FIG. 5, after patterning the polymer material layer, the polymer dielectric layer 510 having via openings O1 is formed. In some embodiments, the polymer dielectric layer 510 has vertical sidewalls 510s in the via openings O1. However, in some alternative embodiments, sidewalls in the via openings O1 may be slightly inclined with respect to the horizontal direction.

In some embodiments, since the polymer dielectric layer 510 is formed of the non-shrinkage material, the surface topography of the polymer dielectric layer 510 may not easily affected by the profile of the underneath structure. That is, although there are one or pits P1 in the molding compound 400, the polymer dielectric layer 510 may be still formed with a substantially planar top surface 510a without recesses (as shown in the enlarged view of the polymer dielectric layer 510 over the pits P1), which is beneficial for the formation of subsequently formed overlying redistribution layer(s).

As shown in FIG. 5, the polymer dielectric layer 510 is formed directly on the molding compound 400 and in contact with the molding compound 400. The polymer dielectric layer 510 covers the top surface 400a of the molding compound 400 and fills up the one or more pits P1 in the molding compound 400. In detail, the polymer dielectric layer 510 includes a body portion 512 over the molding compound 400, and one or more protruding portions 514 protruding from the body portion 512 and extending into the pits P2. In some embodiments, the body portion 512 is in contact with the polymer material 410, and the one or more protruding portions 514 fill and fit with the one or more pits P1. In certain embodiments, outer contours of the one or more protruding portions 514 match the one or more pits P1.

In some alternative embodiments, before forming the polymer dielectric layer 510, a dielectric pre-layer may be formed to fill into the pits P1 for better planarization degree to prevent the subsequently formed overlying redistribution layer(s) from distortion. The dielectric pre-layer may be formed by depositing a dielectric material over the molding compound 400 and then performing a planarization process to remove extra dielectric material outside the pits P1. However, since the embodiments of the invention provide the planar top surface 510a of the polymer dielectric layer 510, the formation of the dielectric pre-layer may be omitted.

Figure 6:
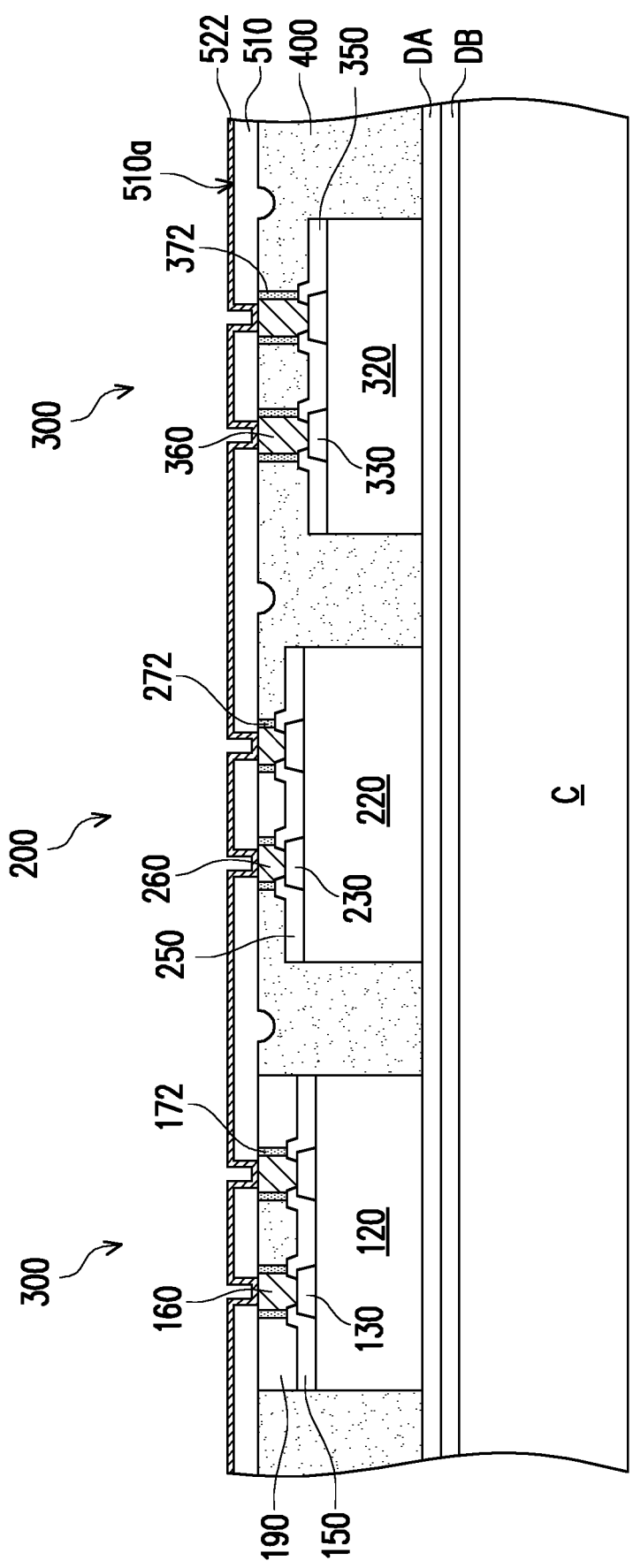

Referring to FIG. 6, in some embodiments, a seed layer 522 is formed on the top surface 510a of the polymer dielectric layer 510 and extends into the via openings O1 of the polymer dielectric layer 510. The seed layer 522 may be formed by a physical vapor deposition process, such as sputtering or the like, and the seed layer 522 may be a metal seed layer such as a copper seed layer, or a composite layer such as a titanium layer and a copper layer over the titanium layer.

Figure 7:
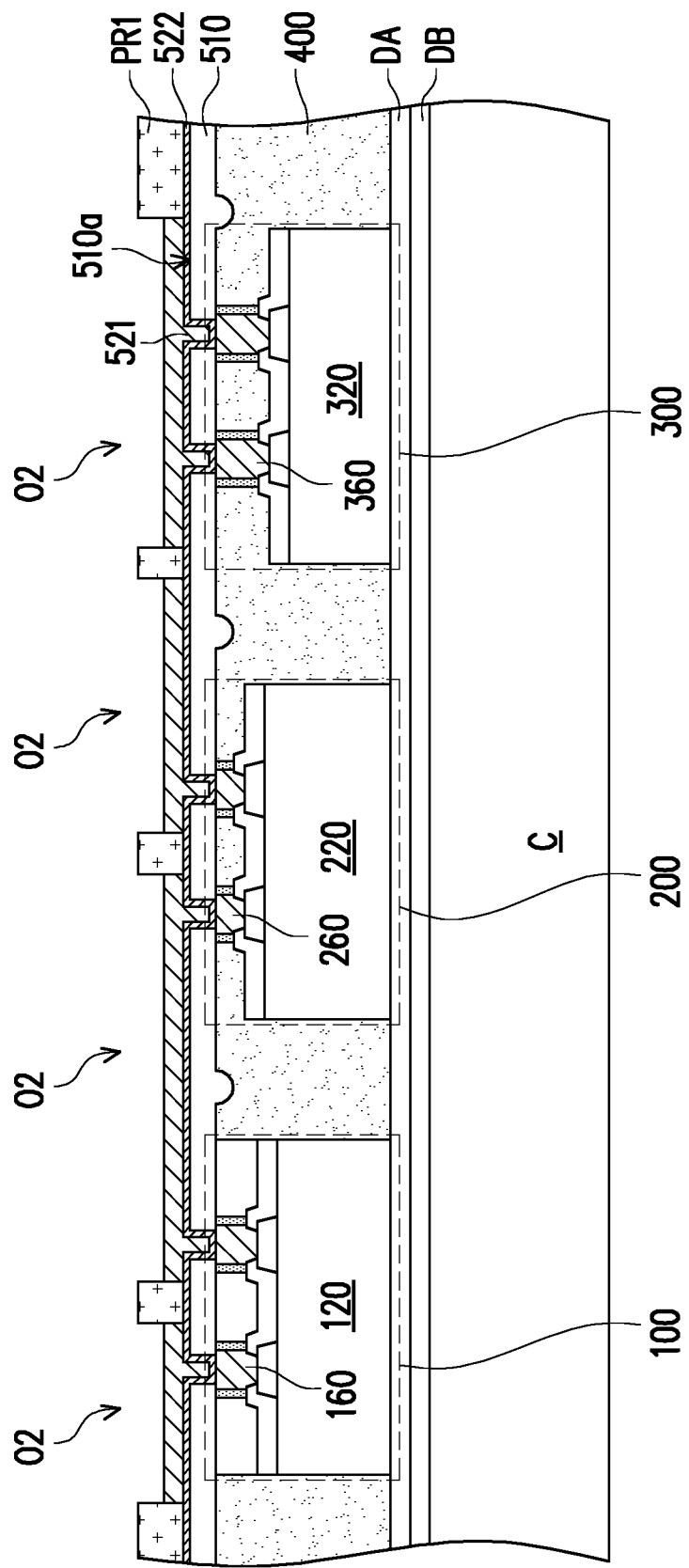

Referring to FIG. 7, in some embodiments, a patterned photoresist layer PR1 having a plurality of openings O2 is formed over the seed layer 522. The plurality of openings O2 of the patterned photoresist layer PR1 at least expose the seed layer 522 covering the via openings O1 of the polymer dielectric layer 510. That is, the openings O2 are wider than the openings O1, and the locations of the openings O2 vertically overlap the locations of the openings O1. In some embodiments, the openings O1 and O2 define the shape and locations of the subsequently formed redistribution layer. Then, a metallic material 521 is formed by, for example, a plating process over the seed layer 522 and filling the openings O2 of the patterned photoresist layer PR1. In some embodiments, the metallic material 521 may include aluminum, titanium, copper, nickel, tungsten, and/or alloys thereof.

Figure 8:
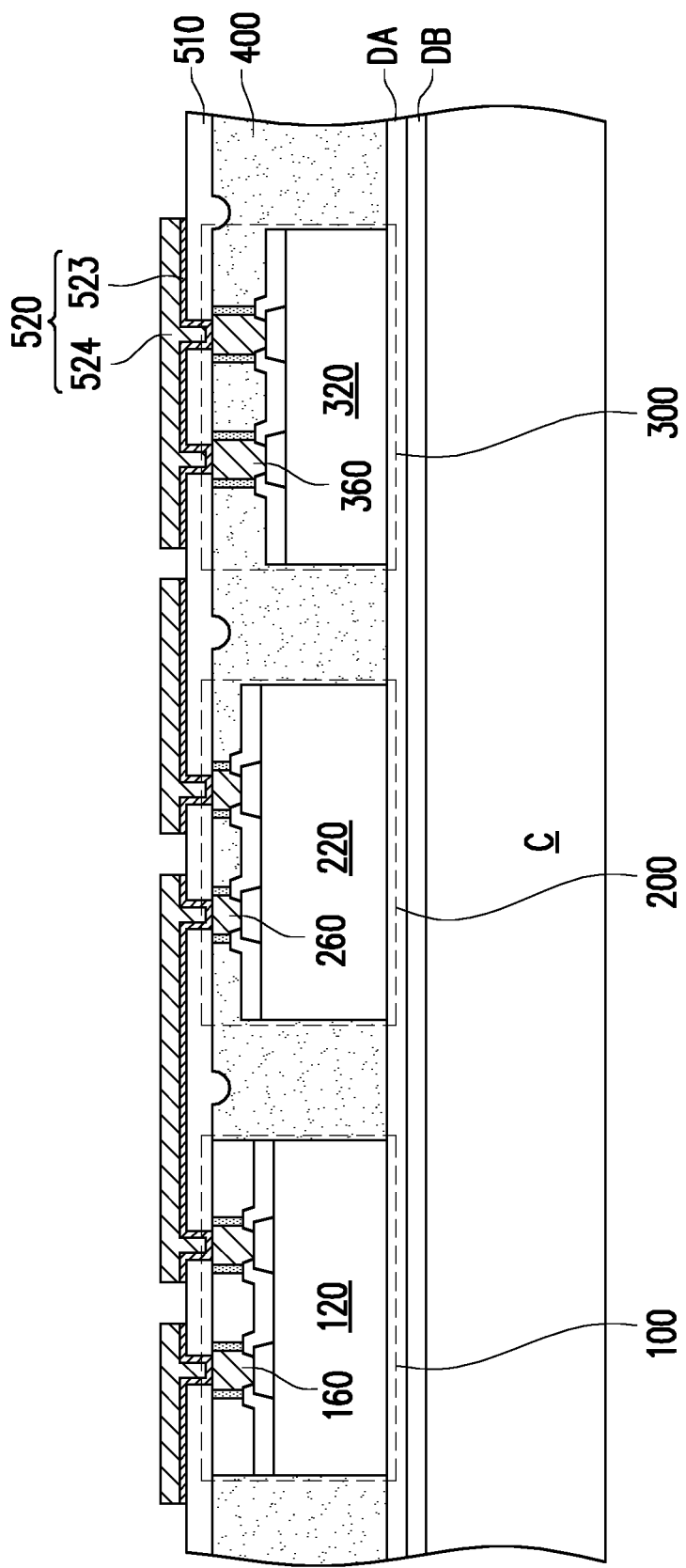

Referring to FIG. 8, in some embodiments, after the patterned photoresist layer PR1 is removed, the redistribution layer 520 is formed. In one embodiment, the seed layer 522 not covered by the metallic material 521 is removed (e.g., by an etching process) to form a patterned seed layer 523. In some embodiments, the redistribution layer 520 includes a metallic layer 524 (e.g. the metallic material filled in the openings O2) and the underlying patterned seed layer 523. In some embodiments, the redistribution layer 520 is formed on the polymer dielectric layer 510 and penetrates through the polymer dielectric layer 510 to be electrically connected to the semiconductor die 100, the semiconductor die 200 and/or the semiconductor die 300.

Figure 9:
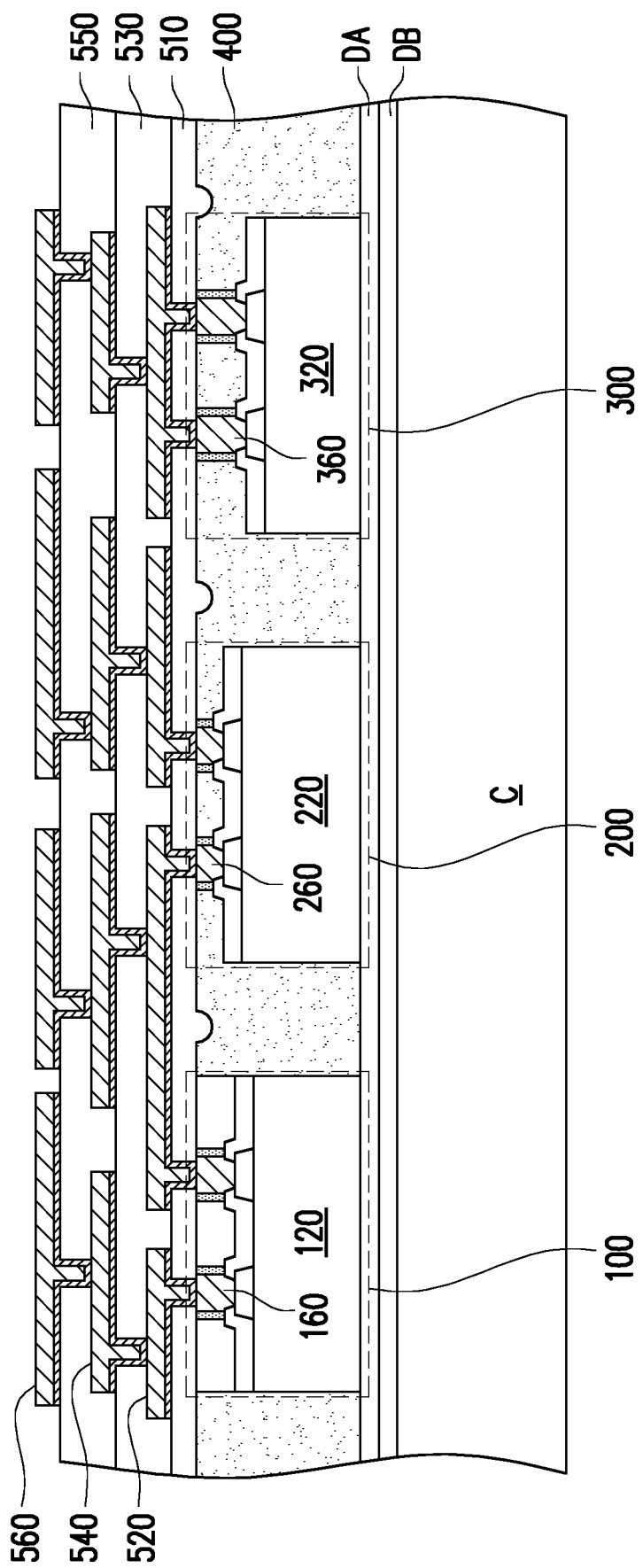

Referring to FIG. 9, in some embodiments, the polymer dielectric layer 530 is formed on the polymer dielectric layer 510 and the redistribution layer 520. The redistribution layer 540 is formed on the polymer dielectric layer 530 and penetrates through the polymer dielectric layer 530 to be electrically connected to the redistribution layer 520. The polymer dielectric layer 550 is formed on the polymer dielectric layer 530 and the redistribution layer 540. The redistribution layer 560 is formed on the polymer dielectric layer 550 and penetrates through the polymer dielectric layer 550 to be electrically connected to the redistribution layer 540. In some embodiments, the polymer dielectric layers 530 and 550 and the redistribution layers 540 and 560 may be formed using the same methods and materials as the polymer dielectric layer 510 and the redistribution layer 520 described above, and the detailed description is thus omitted herein. Since the polymer dielectric layers 530 and 550 may be formed using the same methods and materials as the polymer dielectric layer 510, the polymer dielectric layers 530 and 550 may be also formed with substantially planar top surfaces. In some alternative embodiments, the material the polymer dielectric layers 530 and 550 may be different form the material of the polymer dielectric layer 510, and the material of the polymer dielectric layers 530 and 550 may include polyimide, benzocyclobutene (BCB), polybenzoxazole (PBO), or any other suitable polymer-based dielectric material.

Figure 10:
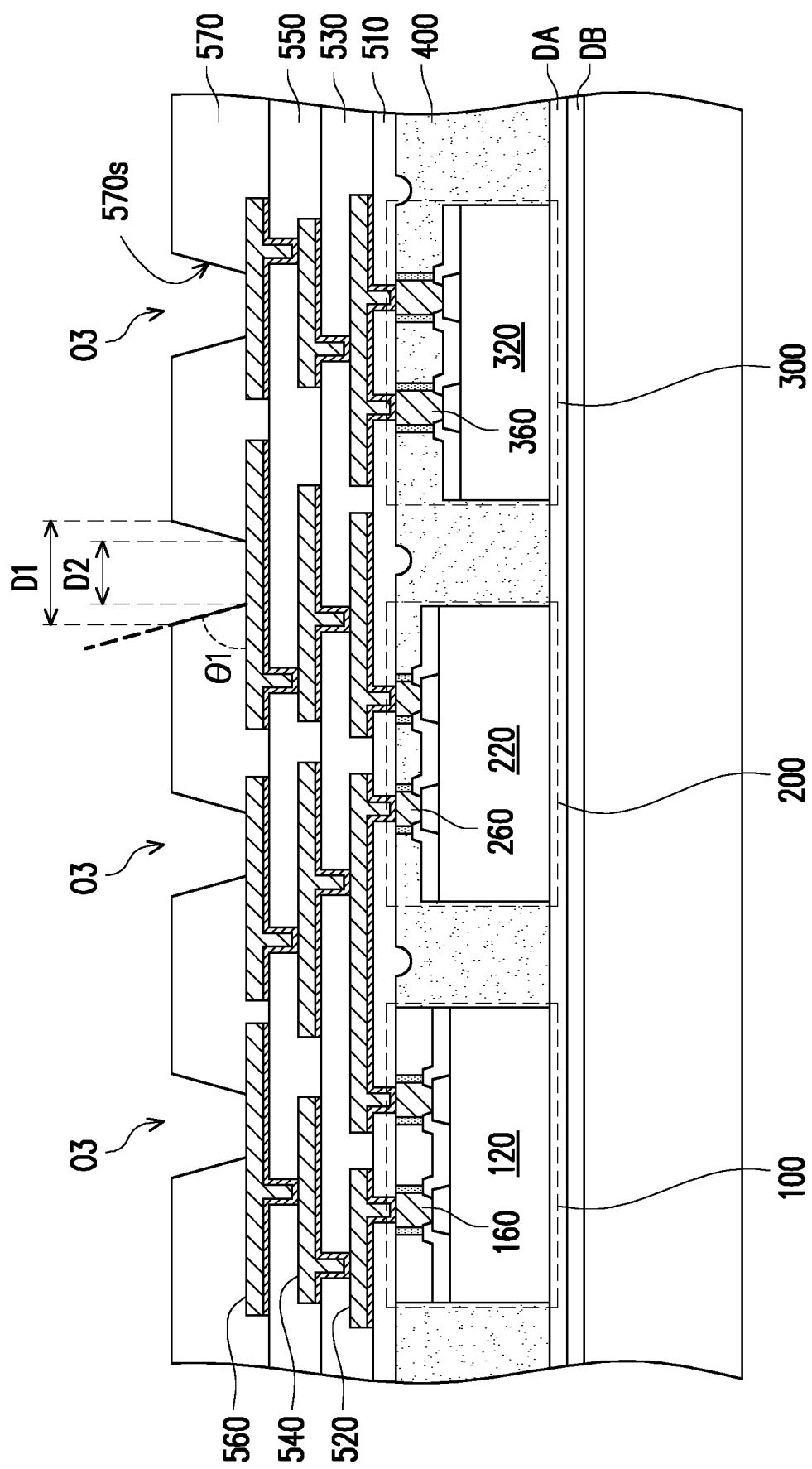

Referring to FIG. 10, in some embodiments, a polymer dielectric layer 570 is formed on the polymer dielectric layer 550 and the redistribution layer 560. The polymer dielectric layer 570 has a plurality of via openings O3 which at least partially expose the redistribution layer 560. In some embodiments, the polymer dielectric layer 570 includes a photo-sensitive material which may be easily patterned by exposure and development processes. In some embodiments, the material of the polymer dielectric layer 570 may be different from the material of at least one of the polymer dielectric layers 510, 530 and 550. For example, the material of the polymer dielectric layer 570 may include polyimide, or the like. In some embodiments, the polymer dielectric layer 570 is formed by lamination. In some embodiments, the polymer dielectric layer 570 is formed by spin-coating a layer of a polymer material (not shown) on the polymer dielectric layer 550 and the redistribution layer 560 and then curing the polymer material. In some embodiments, the temperature of the curing process may be about 170 Celsius degree, for example. Then, the layer of the polymer material is patterned through, for example, exposure and development processes to form the polymer dielectric layer 570. In some embodiments, during the exposure step, multi-wavelength light (e.g. light at g-line, h-line and i-line wavelength) is supplied with an energy dose ranging from about 300 mJ/cm$^2$ to about 600 mJ/cm$^2$. In one embodiment, the multi-wavelength light is irradiated with light at g-line (436 nm, 33%), h-line (405 nm, 33%) and i-line (365 nm, 33%) at the same time. In some embodiments, the exposure conditions (e.g. the light wavelength and the energy dose used in the exposure step) for forming the polymer dielectric layer 570 are different from those for forming at least one of the polymer dielectric layers 510, 530 and 550. In some embodiments, the polymer dielectric layer 570 is made of a negative-type photo-sensitive material, and during the development process, portions of the polymer material layer exposed to g-line, h-line or i-line radiation become insoluble in the developer solution and remain on the underlying structure, while portions not exposed to the g-line, h-line or i-line radiation are removed.

As shown in FIG. 10, after patterning the polymer material layer, the polymer dielectric layer 570 having via openings O3 is formed. In some embodiments, the polymer dielectric layer 570 has tapered sidewalls 570s in the via openings O3. In detail, a top width D1 of the via opening O3 is larger than a bottom width D2 of the via opening O3. In some embodiments, a ratio of the top width D1 to the bottom width D2 may be equal to or larger than 1.2. In some embodiments, the top width D1 may be about 30 µm. In some embodiments, the bottom width D2 may be about 25 µm. In some embodiments, an angle θ1 of the tapered sidewall 570s relative to the bottom of the via opening O3 may range from 70 degrees to 85 degrees, for example. In some embodiments, the angle θ1 of the tapered sidewall 570s relative to the bottom of the via opening O3 may be equal to about 80 degrees. In some embodiments, the polymer dielectric layer 570 is thicker than the underlying polymer dielectric layers 510, 530 and 550. In some embodiments, a thickness of the polymer dielectric layer 570 may range from about 10 µm to about 20 µm.

Figure 11A:
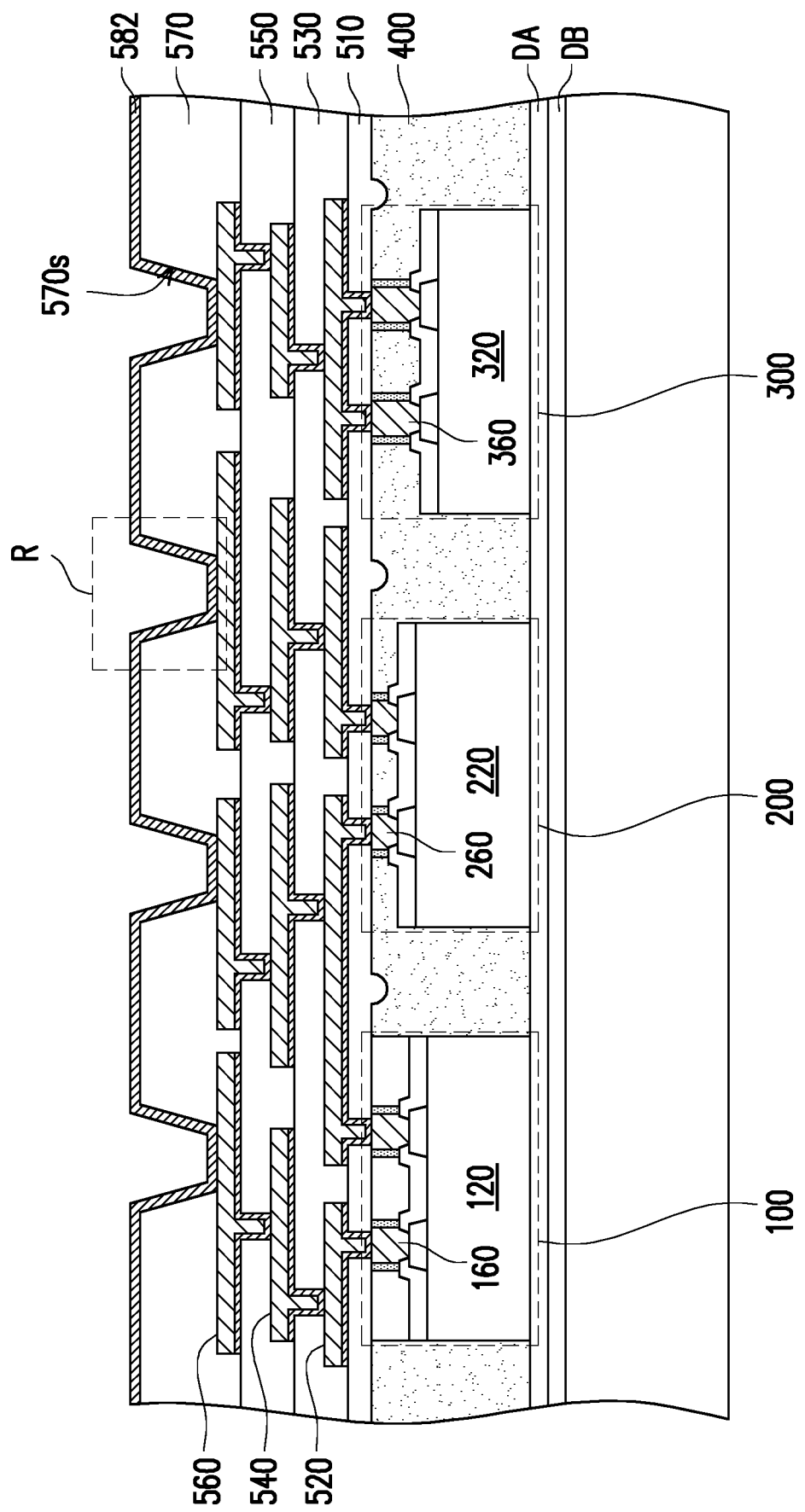

Referring to FIG. 11A, in some embodiments, a seed layer 582 is formed on the top surface of the polymer dielectric layer 570 and extends into the via openings O2 of the polymer dielectric layer 570. The seed layer 582 may be formed by a physical vapor deposition process, such as sputtering or the like, and the seed layer 582 may be a metal seed layer such as a copper seed layer, or a composite layer such as a titanium layer and a copper layer over the titanium layer.

Figure 11B:
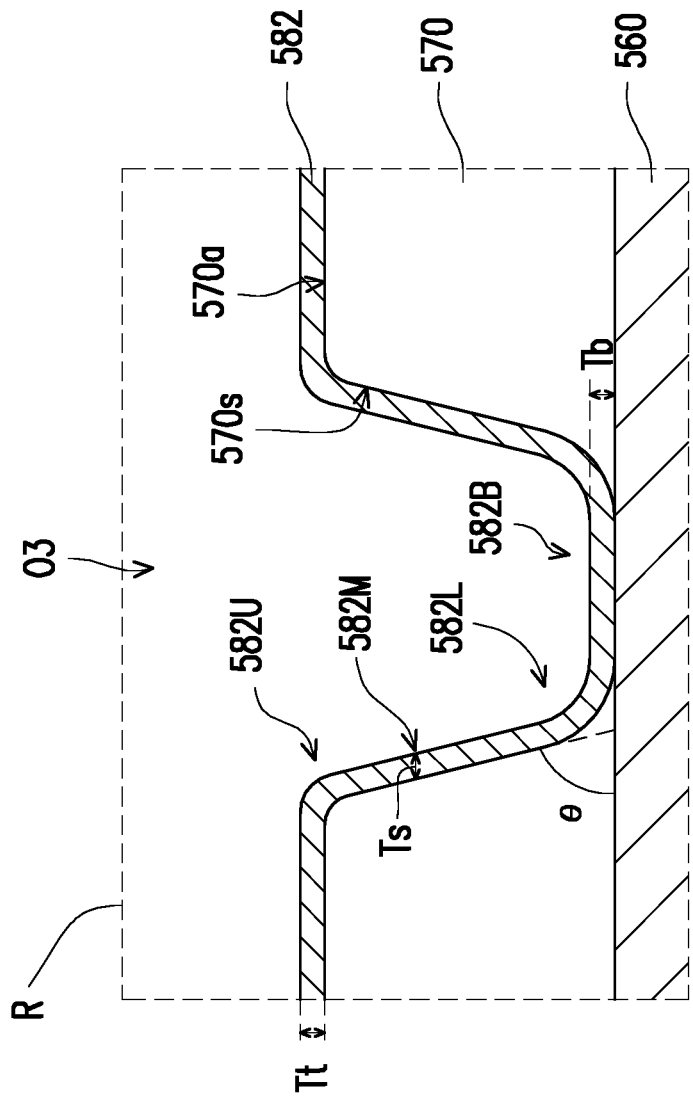
Figure 12:
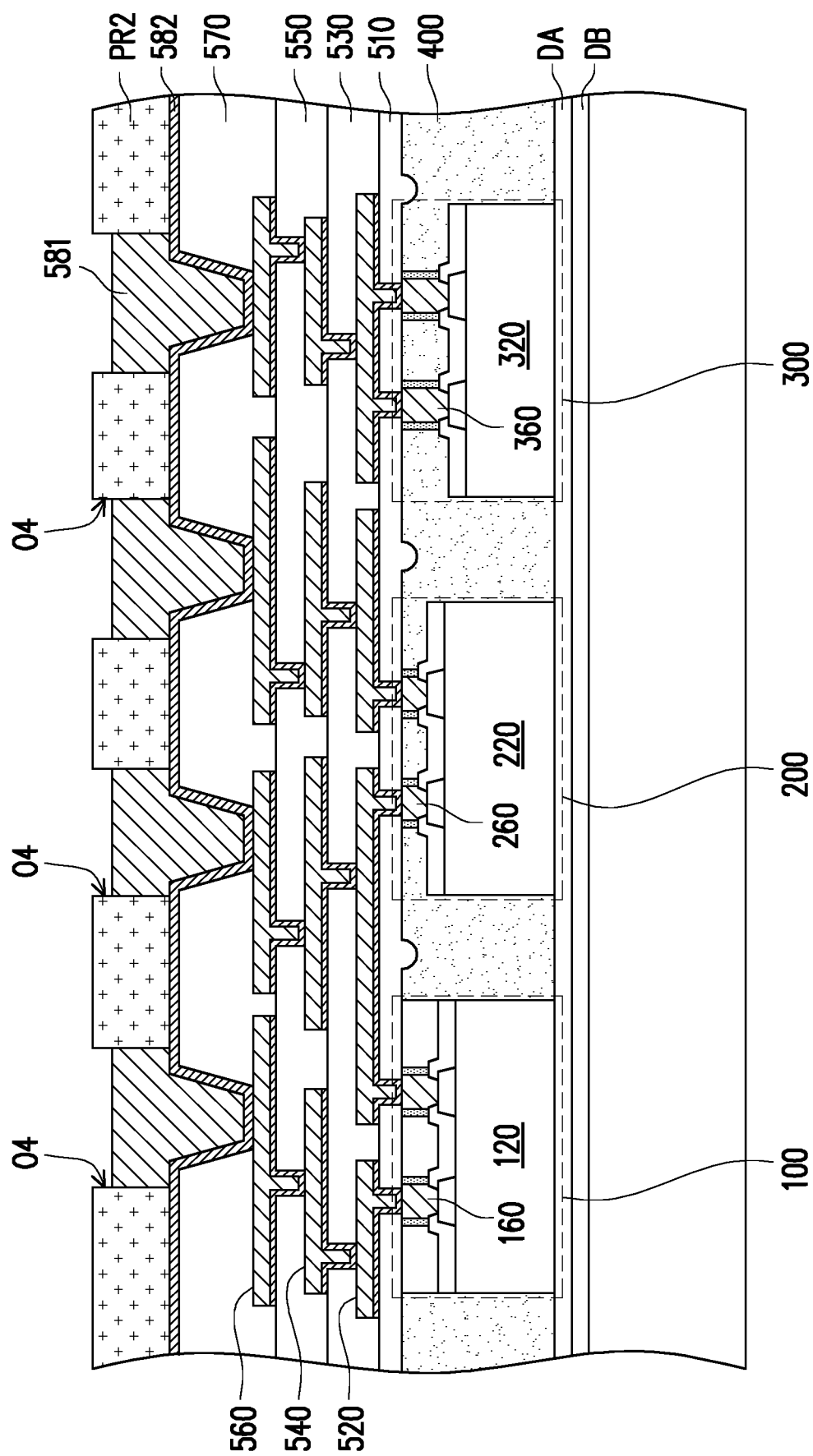

FIG. 11B show a schematic enlarged view of a region R in FIG. 11A. As shown in FIG. 11B, in some embodiments, since the polymer dielectric layer 570 has the tapered sidewalls 570s in the via openings O3 instead of vertical sidewalls, the seed layer 582 may be better deposited into the via openings O3. Therefore, step coverage of the seed layer 582 in the via openings O3 may be improved, which is beneficial for the formation of subsequently plated metallic material 581 (FIG. 12). For example, the step coverage of the seed layer 582 within the via opening O3 refers to a ratio of the thickness of such layer in the via openings O3 to the thickness of such layer outside the via opening O3 (e.g. the thickness of the seed layer 582 located on a top surface 570a of the polymer dielectric layer 570). In some embodiments, as shown in FIG. 11B, the step coverage of a specific portion of the seed layer 582 on the tapered sidewalls 570s in the via openings O3 (e.g. a middle portion 582M of the seed layer 582 on the tapered sidewalls 570s) may be obtained as a ratio of a thickness Ts of the middle portion 582M of the seed layer 582 to a thickness Tt of the seed layer 582 located on the top surface 570a of the polymer dielectric layer 570. Similarly, the step coverage of the seed layer 582 on the redistribution layer 560 in the via openings O3 (e.g. the step coverage of a bottom portion 582B of the seed layer 582) may be obtained as a ratio of a thickness Tb to the thickness Tt of the seed layer 582.

In some embodiments, step coverage of the seed layer 582 in the via openings O3 may be at least equal to or larger than 25%. In some embodiments, the formation rate of the seed layer 582 at different positions along the profile of the via opening O3 may be different, so that the thickness and the step coverage of the seed layer 582 at different positions may be various. In one embodiment, an upper portion 582U of the seed layer 582 on the tapered sidewalls 570s may be thicker and has a step coverage larger than the middle portion 582M of the seed layer 582 on the tapered sidewalls 570s. In one embodiment, a lower portion 582L of the seed layer 582 on the tapered sidewalls 570s is thicker and has a step coverage larger than the middle portion 582M of the seed layer 582. In some embodiments, a ratio of the step coverage of the lower portion 582L of the seed layer 582 on the tapered sidewalls 570s to the step coverage of the middle portion 582M of the seed layer 582 on the tapered sidewalls 570s may be larger than or equal to 2 when the step coverage of the middle portion 582M of the seed layer 582 on the tapered sidewalls 570s is equal to or larger than 25%. In one alternative embodiment, a lower portion 582L of the seed layer 582 on the tapered sidewalls 570s has a step coverage equal to the middle portion 582M of the seed layer 582. In some embodiments, the bottom portion 582B of the seed layer 582 on the redistribution layer 560 may be thickest and has the step coverage larger than various portions of the seed layer 582 on the tapered sidewalls 570s (i.e. the upper portion 582U, the middle portion 582M and the lower portion 582L of the seed layer 582).

In some embodiments, the polymer dielectric layer 570 may have rounded corners between the tapered sidewalls 570s and a top surface 570a of polymer dielectric layer 570. In the cross-section view, the tapered sidewalls 570s at a position in the proximity of the bottom of the polymer dielectric layer 570 may be curved. In some alternative embodiments, the polymer dielectric layer 570 may have sharp corners between the tapered sidewalls 570s and the top surface 570a of polymer dielectric layer 570.

Referring to FIG. 12, in some embodiments, a patterned photoresist layer PR2 having a plurality of openings O4 is formed over the seed layer 582. The plurality of openings O4 of the patterned photoresist layer PR2 at least expose the seed layer 582 covering the via openings O3 of the polymer dielectric layer 570. That is, the openings O4 are wider than the openings O3, and the locations of the openings O4 vertically overlap the locations of the openings O3. In some embodiments, the openings O3 and O4 define the shape and locations of the subsequently formed under-ball metallurgy (UBM) pads. Then, a metallic material 581 is formed by, for example, a plating process over the seed layer 582 and filling the openings O4 of the patterned photoresist layer PR1. In some embodiments, the metallic material 581 may include aluminum, titanium, copper, nickel, tungsten, and/or alloys thereof.

Figure 13A:
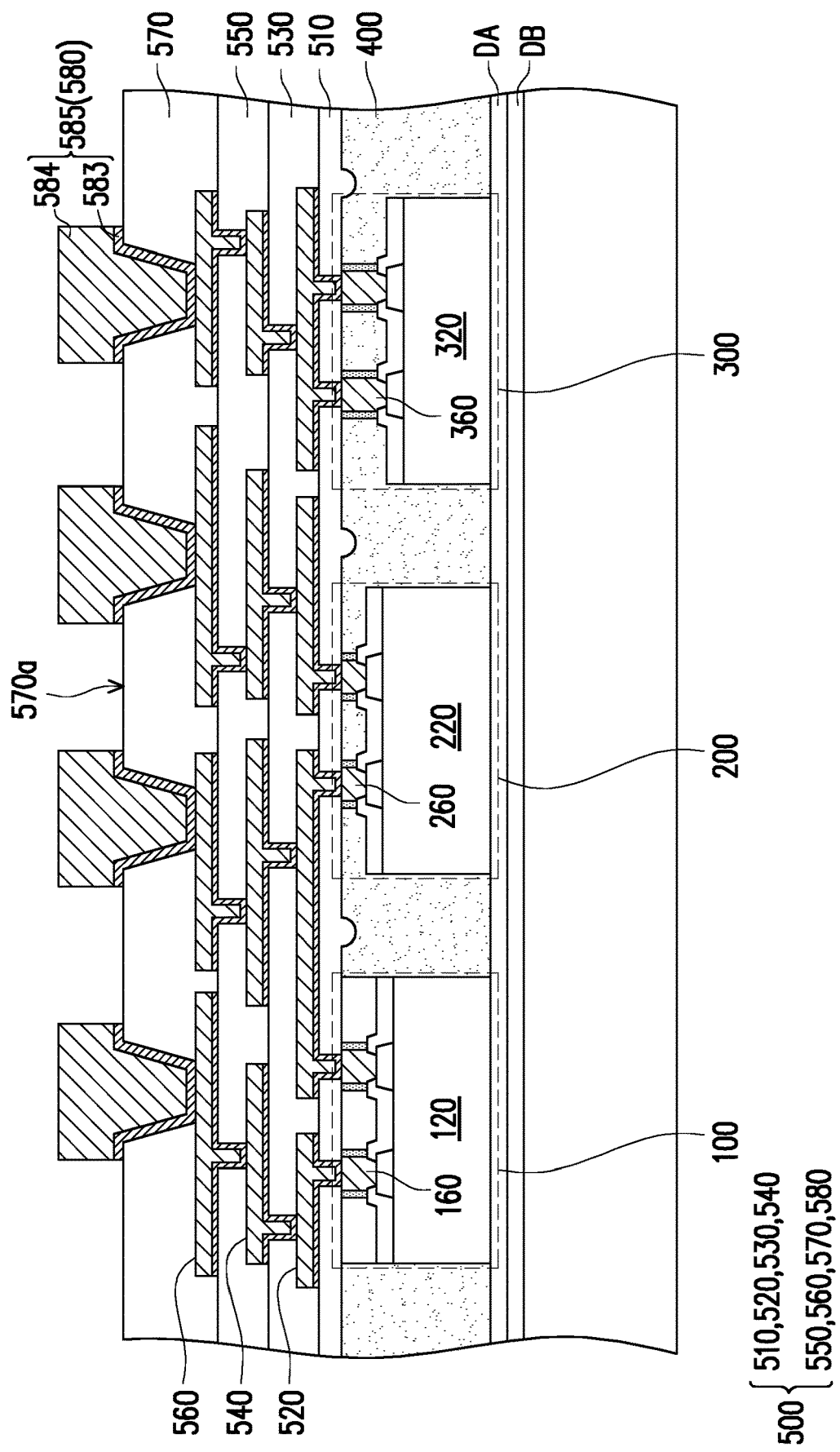

Referring to FIG. 13A, in some embodiments, after the patterned photoresist layer PR2 is removed, the redistribution layer 580 including UBM pads 585 is formed. In one embodiment, the seed layer 582 not covered by the metallic material 581 is removed (e.g., by an etching process) to form a patterned seed layer 583. In some embodiments, the UBM pads 585 includes metallic pads 584 (e.g. the metallic material filled in the openings O4) and the underlying patterned seed layer 583. In some embodiments, the redistribution layer 580 is formed on the polymer dielectric layer 570 and penetrates through the polymer dielectric layer 570 to be electrically connected to the redistribution layer 560. In some embodiments, the topmost redistribution layer 580 includes UBM pads 585 for bump or ball mounting 585 and traces (not shown).

Figure 13B:
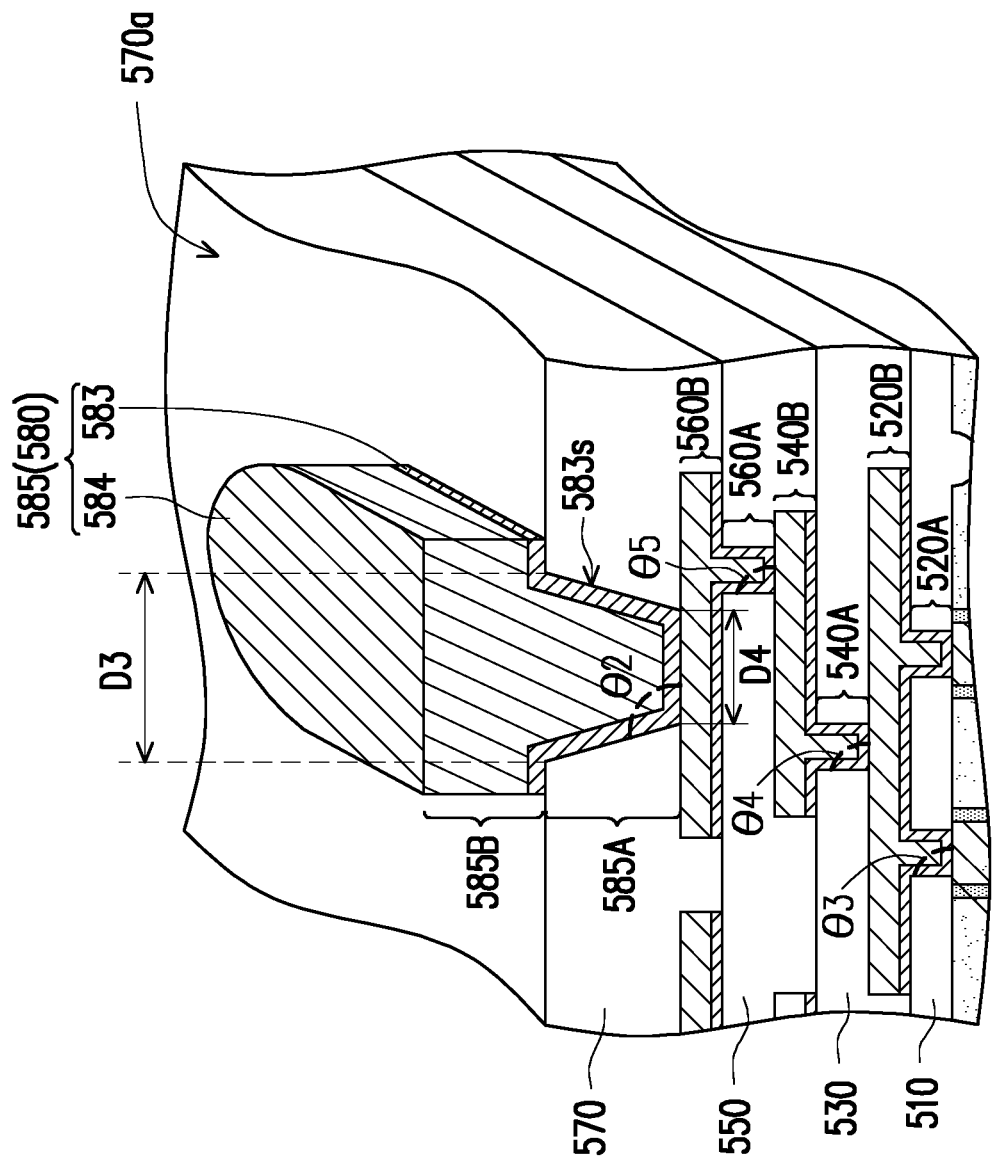

FIG. 13B show a schematic enlarged stereogram of a portion of the redistribution structure 500 in FIG. 13A. In some embodiments, the redistribution layer 520 includes a via portion 520A and a wiring potion 520B on the via portion 520A. The via portion 520A is embedded in the polymer dielectric layer 510, and the wiring potion 520 is over the polymer dielectric layer 510. In some embodiments, the redistribution layer 540 includes a via portion 540A and a wiring potion 540B on the via portion 540A. The via portion 540A is embedded in the polymer dielectric layer 530, and the wiring potion 540B is over the polymer dielectric layer 530. In some embodiments, the redistribution layer 560 includes a via portion 560A and a wiring potion 560B on the via portion 540A. The via portion 560A is embedded in the polymer dielectric layer 550, and the wiring potion 560B is over the polymer dielectric layer 550. In FIG. 13B, the UBM pad 585 of the topmost redistribution layer 580 is shown. In some embodiments, the UBM pad 585 includes a via portion 585A embedded in the polymer dielectric layer 570 and a pad portion 585B protruded from the top surface 570a of the polymer dielectric layer 570. In one embodiment, the pad portion 585B from the top view may be shaped as a round or oval pad.

In some embodiments, the via portion 585A of the topmost redistribution layer 580 has tapered sidewalls 583s. In some embodiments, the slope and the profile of the tapered sidewall(s) of the via portion 585A principally match those of the tiled sidewalls 570s of the polymer dielectric layer 570. In detail, a top width D3 of the via portion 585A is larger than a bottom width D4 of the via portion 585A. In some embodiments, a ratio of the top width D3 to the bottom width D4 may be equal to or larger than 1.2. In some embodiments, the top width D3 may be about 30 μm. In some embodiments, the bottom width D4 may be about 25 μm.

In some embodiments, a base angle θ2 (referred to the angle between the sidewalls and the bottom surface of the via portion) of the via portion 585A of the topmost redistribution layer 580 is larger than a base angle of at least one of the via portions of the underlying polymer dielectric layers. For example, in some embodiments, the base angle θ2 of the via portion 585A of the topmost redistribution layer 580 is larger than a base angle θ3 of the via portion 520A of the redistribution layer 520. In some embodiments, the base angle θ2 of the via portion 585A of the topmost redistribution layer 580 is larger than a base angle θ4 of the via portion 540A of the redistribution layer 540. In some embodiments, the base angle θ2 of the via portion 585A of the topmost redistribution layer 580 is larger than a base angle θ5 of the via portion 560A of the redistribution layer 560. In some embodiments, the base angle θ2 of the via portion 585A of the topmost redistribution layer 580 may range from 95 degrees to 110 degrees, for example. In some embodiments, the base angle θ2 of the via portion 585A of the topmost redistribution layer 580 may be equal to about 100 degrees. In some embodiments, the base angle θ3 of the via portion 520A of the redistribution layer 520, the base angle θ4 of the via portion 540A of the redistribution layer 540 and the base angle θ5 of the via portion 560A of the redistribution layer 560 may be 90 degrees or other degrees less than the base angle θ2 of the via portion 585A.

Figure 14:
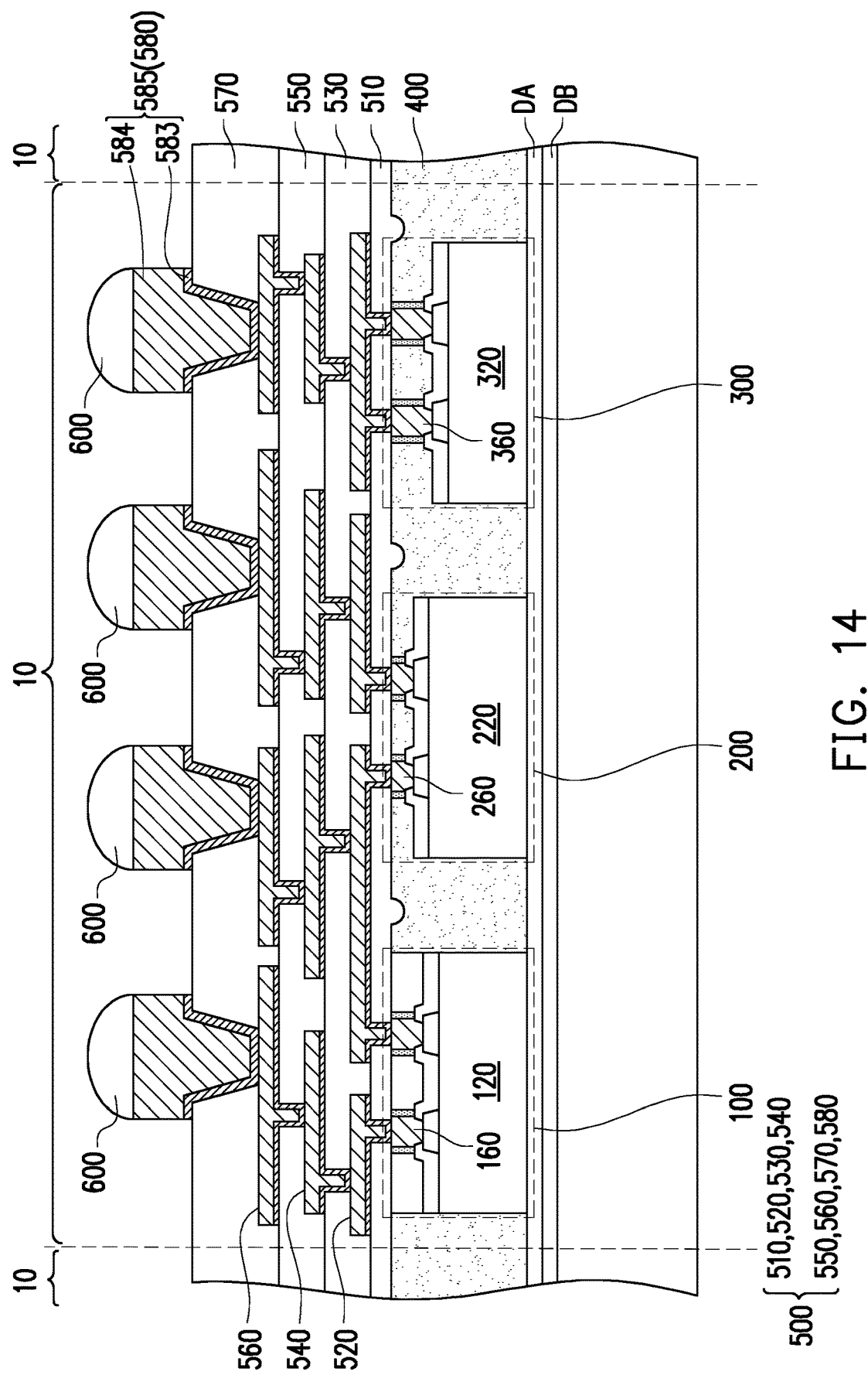

Referring to FIG. 14, in some embodiments, a plurality of conductive connectors 600 disposed on the UBM pads 585 of the topmost redistribution layer 580 are formed. In some embodiments, prior to disposing the conductive connectors 600, solder paste or flux (not shown) is applied so that the conductive connectors 600 are better fixed to the UBM pads 585 of the topmost redistribution layer 580. In some embodiments, the conductive connector 600 includes a conductive bump, a solder ball, a controlled collapse chip connection (C4) bump, or ball grid array (BGA) balls, or the like. In some embodiments, the conductive connectors 600 may be placed on the UBM pads 585 of the redistribution layer 580 through a ball placement process. In some embodiments, the arrangement and configurations of the UBM pads 585 and the conductive connectors 600 may be determined based on circuit design. Then, a singulation process may be performed to cut through at least the redistribution structure 500 and the molding compound 400 along the cutting lanes (represented by the dotted lines) to individualize the semiconductor packages 10. In one embodiment, the singulation process is a wafer dicing process including mechanical sawing or laser cutting.

Figure 15:
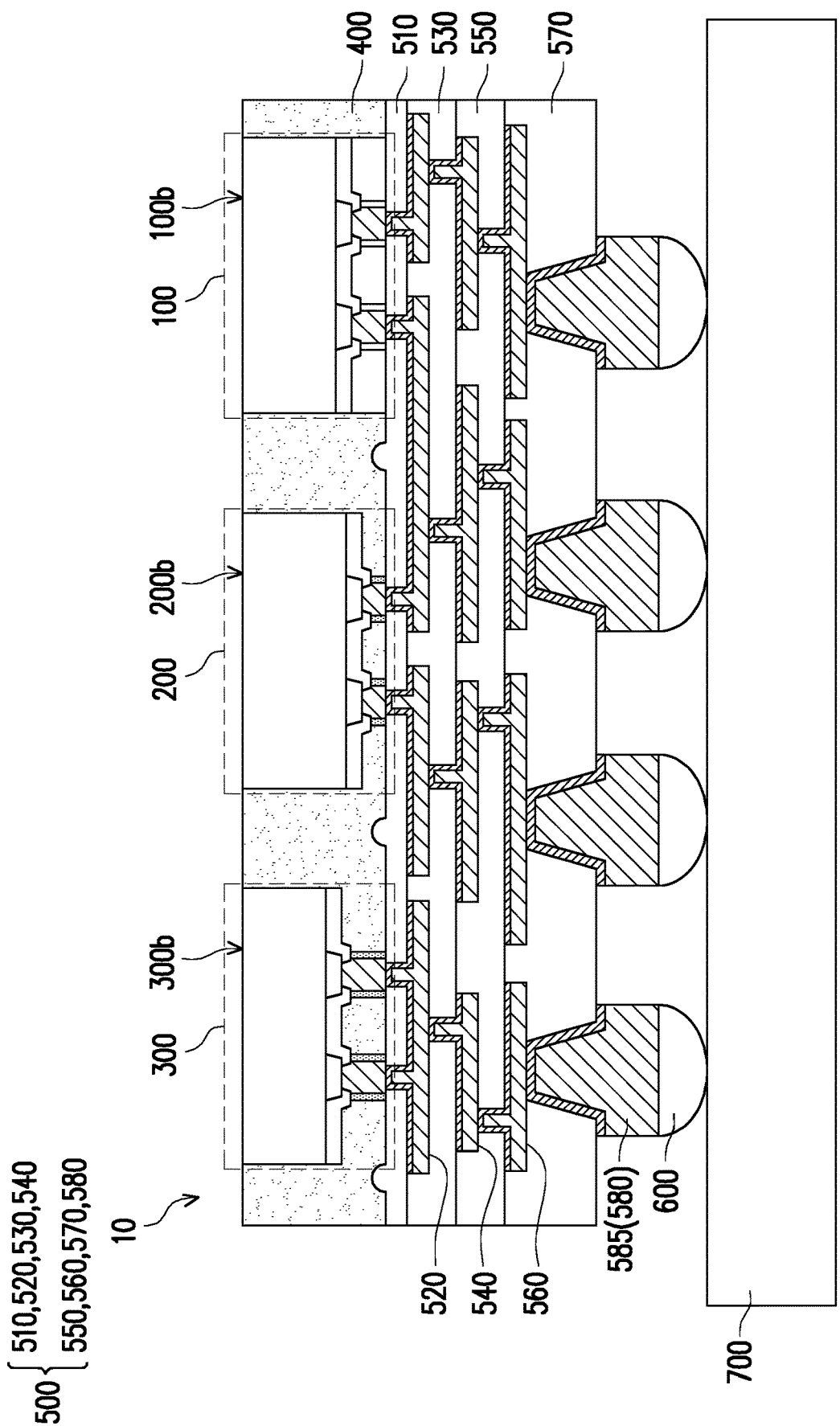

Referring to FIG. 15, in some embodiments, after the singulation process, the semiconductor package 10 is flipped. Then, the carrier C is debonded and removed from the die attach film DA. In some embodiments, the die attach film DA is easily separated from the carrier C due to the debond layer DB therebetween. In some embodiments, the carrier C is detached from the die attach film DA through a debonding process, where the carrier C and the debond layer DB are removed, and the die attach film DA is exposed. In one embodiment, the debonding process is a laser debonding process. In some embodiments, the die attach film DA may be subsequently removed, and the rear surface 100b of the semiconductor die 100, the rear surface 200b of the semiconductor die 200 and the rear surface 300b of the semiconductor die 300 are exposed. Alternatively, in some embodiments, the die attach film DA may be optionally remained. In some embodiments, the semiconductor package 10 may be further mounted to a circuit substrate 700 (such as a printed circuit board (PCB)) by connecting the conductive connectors 600 to the circuit substrate 700. In some alternative embodiments, the semiconductor package 10 may be mounted onto another package or sub-package unit.

According to some embodiments, a semiconductor package includes a first die, a second die, a molding compound and a redistribution structure. The first die has a first conductive pillar and a first complex compound sheath surrounding and covering a sidewall of the first conductive pillar. The second die has a second conductive pillar and a protection layer laterally surrounding the second conductive pillar. The molding compound laterally surrounds and wraps around the first die and the second die, wherein the molding compound is in contact with the first complex compound sheath of the first die. The redistribution structure is disposed on the first die, the second die and the molding compound, wherein the redistribution structure has a first polymer dielectric layer farther away from the first and second dies and a second polymer dielectric layer closer to the first and second dies, the first and second polymer dielectric layers are made of different materials. The redistribution structure has a first via portion embedded in the first polymer dielectric layer and a second via portion embedded in the second polymer dielectric layer, and a base angle of the first via portion is greater than a base angle of the second via portion.

According to some embodiments, a semiconductor package includes a first die, a second die, a molding compound and a redistribution structure. The first die has a first conductive pillar. The second die has a second conductive pillar, a protection layer laterally surrounding the second conductive pillar and a complex compound sheath between the second conductive pillar and the protection layer. The molding compound laterally surrounds and wraps around the first die and the second die. The redistribution structure is disposed on the first die, the second die and the molding compound, wherein the redistribution structure has a first polymer dielectric layer farther away from the first and second dies and a second polymer dielectric layer closer to the first and second dies, the first and second polymer dielectric layers are made of different materials. The redistribution structure has a first via portion embedded in the first polymer dielectric layer and a second via portion embedded in the second polymer dielectric layer, and a ratio of a top width of the first via portion to a bottom width of the first via portion is larger than a ratio of a top width of the second via portion to a bottom width of the second via portion.

According to some embodiments, a method of forming a semiconductor package includes the following steps. A first die having a first conductive pillar disposed thereon is provided. A second die having a second conductive pillar disposed thereon is provided. A protection layer laterally surrounding the second conductive pillar is formed. A first complex compound layer covering a top surface and a sidewall of the first conductive pillar is formed. A molding compound encapsulating and wrapping around the first die and the second die is formed such that the molding compound is in contact with the first complex compound layer. The molding compound is planarized to expose the first conductive pillar and the second conductive pillar, so that the first complex compound layer is partially removed to form a first complex compound sheath surrounding and covering the sidewall of the first conductive pillar. A layer of a first polymer material is formed over the first die, the second die and the planarized molding compound. The layer of the first polymer material is patterned by performing a first exposure process to form a first polymer dielectric layer having a first via opening. A first redistribution layer is formed on the first polymer dielectric layer and in the first via opening. A layer of a second polymer material different from the first polymer material is formed over the first polymer dielectric layer and the first redistribution layer. The layer of the second polymer material is patterned by performing a second exposure process different from the first exposure process to form a second polymer dielectric layer having a second via opening, wherein a ratio of a top width of the second via opening to a bottom width of the second via opening is larger than a ratio of a top width of the first via opening to a bottom width of the first via opening. A second redistribution layer is formed on the second polymer dielectric layer and in the second via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first die, having a first conductive pillar and a first complex compound sheath surrounding and covering a sidewall of the first conductive pillar;
   a second die, having a second conductive pillar and a protection layer laterally surrounding the second conductive pillar;
   a molding compound, laterally surrounding and wrapping around the first die and the second die, wherein the molding compound is in contact with the first complex compound sheath of the first die; and
   a redistribution structure, disposed on the first die, the second die and the molding compound, wherein the redistribution structure has a first polymer dielectric layer farther away from the first and second dies and a second polymer dielectric layer closer to the first and second dies, the first and second polymer dielectric layers are made of different materials, and
   wherein the redistribution structure has a first via portion embedded in the first polymer dielectric layer and a second via portion embedded in the second polymer dielectric layer, and a base angle of the first via portion is greater than a base angle of the second via portion.

2. The semiconductor package of claim 1, wherein the redistribution structure further includes a pad portion connected to the first via portion, and the pad portion protrudes from the first polymer dielectric layer.

3. The semiconductor package of claim 1, wherein the second polymer dielectric layer is in physical contact with the molding compound.

4. The semiconductor package of claim 3, wherein the second polymer dielectric layer has at least one protruding portion extending into the molding compound.

5. The semiconductor package of claim 1, wherein the second die further has a second complex compound sheath between the second conductive pillar and the protection layer.

6. The semiconductor package of claim 1, wherein the base angle of the first via portion ranges from 95 degrees to 110 degrees.

7. The semiconductor package of claim 1, wherein the first complex compound sheath comprises a metal complex of imidazole derivative.

8. A semiconductor package, comprising:
a first die, having a first conductive pillar;
a second die, having a second conductive pillar, a protection layer laterally surrounding the second conductive pillar and a complex compound sheath between the second conductive pillar and the protection layer;
a molding compound, laterally surrounding and wrapping around the first die and the second die; and
a redistribution structure, disposed on the first die, the second die and the molding compound, wherein the redistribution structure has a first polymer dielectric layer farther away from the first and second dies and a second polymer dielectric layer closer to the first and second dies, the first and second polymer dielectric layers are made of different materials, and
wherein the redistribution structure has a first via portion embedded in the first polymer dielectric layer and a second via portion embedded in the second polymer dielectric layer, and a ratio of a top width of the first via portion to a bottom width of the first via portion is larger than a ratio of a top width of the second via portion to a bottom width of the second via portion.

9. The semiconductor package of claim 8, wherein the redistribution structure further includes a pad portion connected to the first via portion, and the pad portion protrudes from the first polymer dielectric layer.

10. The semiconductor package of claim 8, wherein the second polymer dielectric layer is in physical contact with the molding compound.

11. The semiconductor package of claim 10, wherein the second polymer dielectric layer has at least one protruding portion extending into the molding compound.

12. The semiconductor package of claim 8, wherein the complex compound sheath comprises a metal complex of imidazole derivative.

13. A method of forming a semiconductor package, comprising:
providing a first die having a first conductive pillar disposed thereon;
providing a second die having a second conductive pillar disposed thereon and forming a protection layer laterally surrounding the second conductive pillar;
forming a first complex compound layer covering a top surface and a sidewall of the first conductive pillar;
forming a molding compound encapsulating and wrapping around the first die and the second die such that the molding compound is in contact with the first complex compound layer; and
planarizing the molding compound to expose the first conductive pillar and the second conductive pillar, so that the first complex compound layer is partially removed to form a first complex compound sheath surrounding and covering the sidewall of the first conductive pillar;
forming a layer of a first polymer material over the first die, the second die and the planarized molding compound and patterning the layer of the first polymer material by performing a first exposure process to form a first polymer dielectric layer having a first via opening;
forming a first redistribution layer on the first polymer dielectric layer and in the first via opening;
forming a layer of a second polymer material different from the first polymer material over the first polymer dielectric layer and the first redistribution layer and patterning the layer of the second polymer material by performing a second exposure process different from the first exposure process to form a second polymer dielectric layer having a second via opening, wherein a ratio of a top width of the second via opening to a bottom width of the second via opening is larger than a ratio of a top width of the first via opening to a bottom width of the first via opening; and
forming a second redistribution layer on the second polymer dielectric layer and in the second via opening.

14. The method of claim 13, wherein performing the first exposure process includes supplying a first light with a first energy dose, and performing the second exposure process includes supplying a second light with a second energy dose, wherein the first energy dose is higher than the second energy dose.

15. The method of claim 13, wherein the ratio of the top width of the second via opening to the bottom width of the second via opening is equal to or larger than 1.2.

16. The method of claim 13, further comprising forming a second complex compound layer covering a top surface and a sidewall of the second conductive pillar before forming the protection layer, and the second complex compound layer is partially removed to form a second complex compound sheath surrounding and covering the sidewall of the second conductive pillar after planarizing the molding compound.

17. The method of claim 13, wherein the first polymer dielectric layer is formed directly on and in contact with the planarized molding compound.

18. The method of claim 17, wherein after planarizing the molding compound, one or more pits are formed in the planarized molding compound, and wherein forming the first polymer dielectric layer includes forming one or more protruding portions to fill the one or more pits.

19. The method of claim 13, wherein forming the first complex compound layer includes applying an organic compound solution over the first conductive pillar.

20. The method of claim 19, wherein applying the organic compound solution over the first conductive pillar includes performing a spraying process or a dipping process.

* * * * *